(12) United States Patent
Chang et al.

(10) Patent No.: US 9,837,635 B2
(45) Date of Patent: Dec. 5, 2017

(54) PROTECTIVE STRUCTURE HAVING ANTI-SCRATCH LAYER

(71) Applicant: Industrial Technology Research Institute, Hsinchu (TW)

(72) Inventors: Chih-Chia Chang, Hsinchu County (TW); Cheng-Chung Lee, Hsinchu (TW); Kuang-Jung Chen, Hsinchu County (TW); Kai-Ming Chang, New Taipei (TW); Jui-Chang Chuang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/377,980

(22) Filed: Dec. 13, 2016

(65) Prior Publication Data

US 2017/0179434 A1 Jun. 22, 2017

Related U.S. Application Data

(60) Provisional application No. 62/268,507, filed on Dec. 17, 2015.

(30) Foreign Application Priority Data

Sep. 5, 2016 (TW) .............................. 105128620 A

(51) Int. Cl.
*H01L 51/52* (2006.01)
*H01L 27/32* (2006.01)
*H01L 51/00* (2006.01)

(52) U.S. Cl.
CPC ........ *H01L 51/5256* (2013.01); *H01L 27/322* (2013.01); *H01L 27/3272* (2013.01); *H01L 51/004* (2013.01); *H01L 51/5284* (2013.01)

(58) Field of Classification Search
CPC ............. H01L 51/5253; H01L 51/5256; H01L 51/5259; H01L 2224/022; H01L 224/02206
See application file for complete search history.

(56) References Cited

U.S. PATENT DOCUMENTS

| 5,492,589 A | 2/1996 | Mizuno |
| 7,576,975 B2 | 8/2009 | Tai et al. |

(Continued)

FOREIGN PATENT DOCUMENTS

| CN | 203994951 | 12/2014 |
| TW | M472617 | 2/2014 |

(Continued)

OTHER PUBLICATIONS

"Office Action of Taiwan Counterpart Application," dated Jul. 17, 2017, p. 1-p. 15.

*Primary Examiner* — Hoai V Pham
(74) *Attorney, Agent, or Firm* — JCIPRNET

(57) ABSTRACT

A protective structure includes an impact resistant structure and an anti-scratch structure. The impact resistant structure includes a plurality of buffer structures and a plurality of filling structures located around the buffer structures. The anti-scratch structure is located over the impact resistant structure. The anti-scratch structure includes a hard coat layer which covers the impact resistant structure, and a surface anti-scratch layer which covers the hard coat layer.

20 Claims, 42 Drawing Sheets

(56) References Cited

U.S. PATENT DOCUMENTS

| | | | |
|---|---|---|---|
| 7,688,497 B2 | 3/2010 | Danner et al. | |
| 9,219,515 B2 | 12/2015 | Choiniere et al. | |
| 9,755,188 B2 * | 9/2017 | Choi | H01L 51/0097 |
| 2013/0154979 A1 | 6/2013 | Li et al. | |
| 2016/0040027 A1 | 2/2016 | Woo et al. | |

FOREIGN PATENT DOCUMENTS

| | | |
|---|---|---|
| TW | M491514 | 12/2014 |
| TW | M506710 | 8/2015 |

* cited by examiner

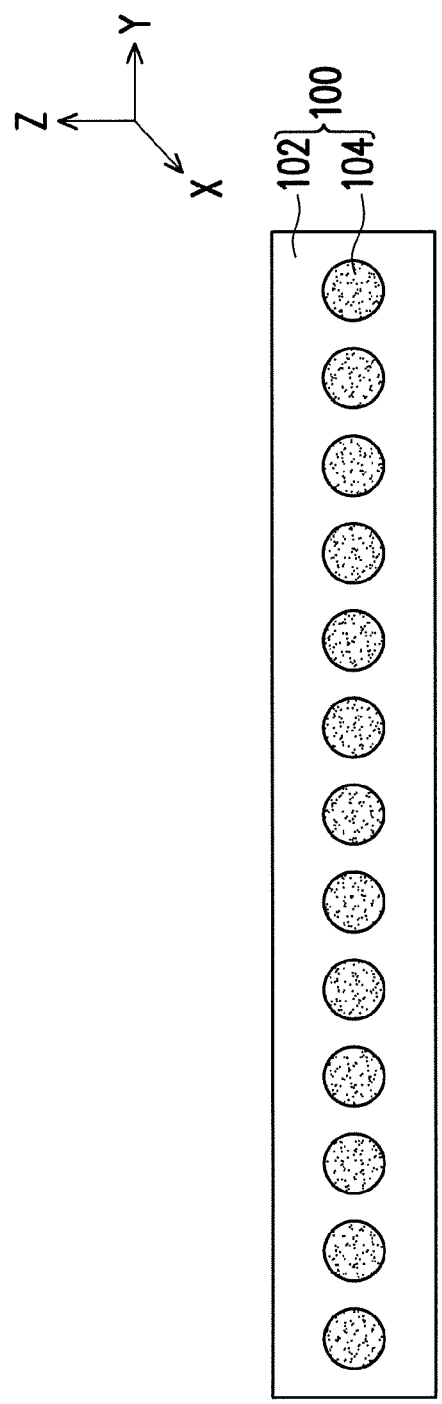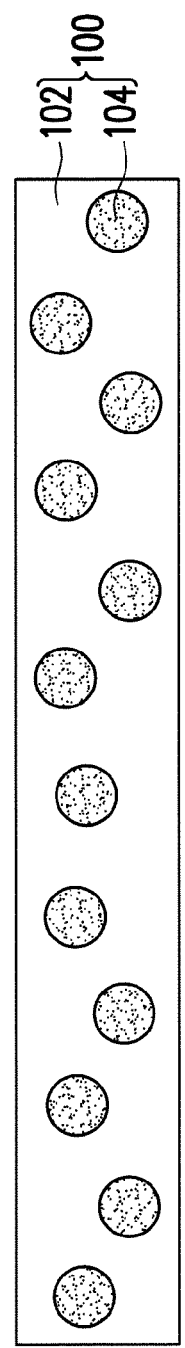
FIG. 2C
FIG. 2D

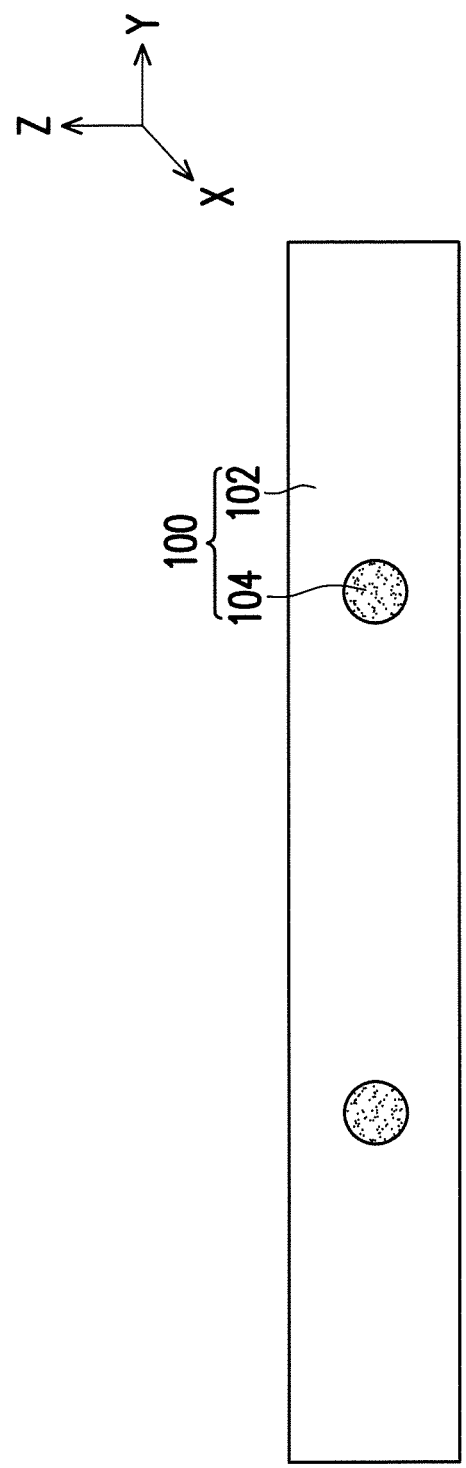

PROTECTIVE STRUCTURE HAVING ANTI-SCRATCH LAYER

CROSS-REFERENCE TO RELATED APPLICATION

This application claims the priority benefits of U.S. provisional application Ser. No. 62/268,507, filed on Dec. 17, 2015 and Taiwan application serial no. 105128620, filed on Sep. 5, 2016. The entirety of each of the above-mentioned patent applications is hereby incorporated by reference herein and made a part of this specification.

TECHNICAL FIELD

The disclosure relates to an anti-scratch and impact-resistant structure and an electronic apparatus.

BACKGROUND

An electronic device (e.g., flexible electronic device) may have less mechanical strength and hardness after being lighter and thinner, and consequently may be easily damaged when scratched, hit, or pressed by an external force during the manufacturing process, delivery, or use, which impairs the reliability.

SUMMARY

According to an embodiment of the disclosure, a protective structure including an impact resistant structure and an anti-scratch structure is provided. The impact resistant structure includes a plurality of buffer structures and a plurality of filling structures. The filling structures are located around the buffer structures. The anti-scratch structure is located over the impact resistant structure. The anti-scratch structure includes a hard coat layer covering the impact resistant structure and a surface anti-scratch layer covering the hard coat layer.

According to another embodiment of the disclosure, a protective structure including a light filter structure and an anti-scratch structure is provided. The light filter structure at least includes a plurality of light filter layers. The anti-scratch structure is located over the light filter structure. The anti-scratch structure includes a hard coat layer covering the light filter structure and a surface anti-scratch layer covering the hard coat layer. A Young's modulus of the surface anti-scratch layer is greater than a Young's modulus of the hard coat layer.

According to yet another embodiment of the disclosure, an electronic apparatus is provided, which includes an electronic device and the protective structure located on the electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2E are schematic cross-sectional views of several first substrates according to some embodiments of the disclosure.

DESCRIPTION OF THE EMBODIMENTS

Several protective structures are provided according to the embodiments of the disclosure. The protective structures may be formed in or attached to an electronic device (e.g., flexible electronic device) to prevent the electronic device from being scratched by an external force as well as reduce damage to the electronic device caused by impact or pressure of the external force, and thereby improve reliability of an electronic product.

Figure 1A:
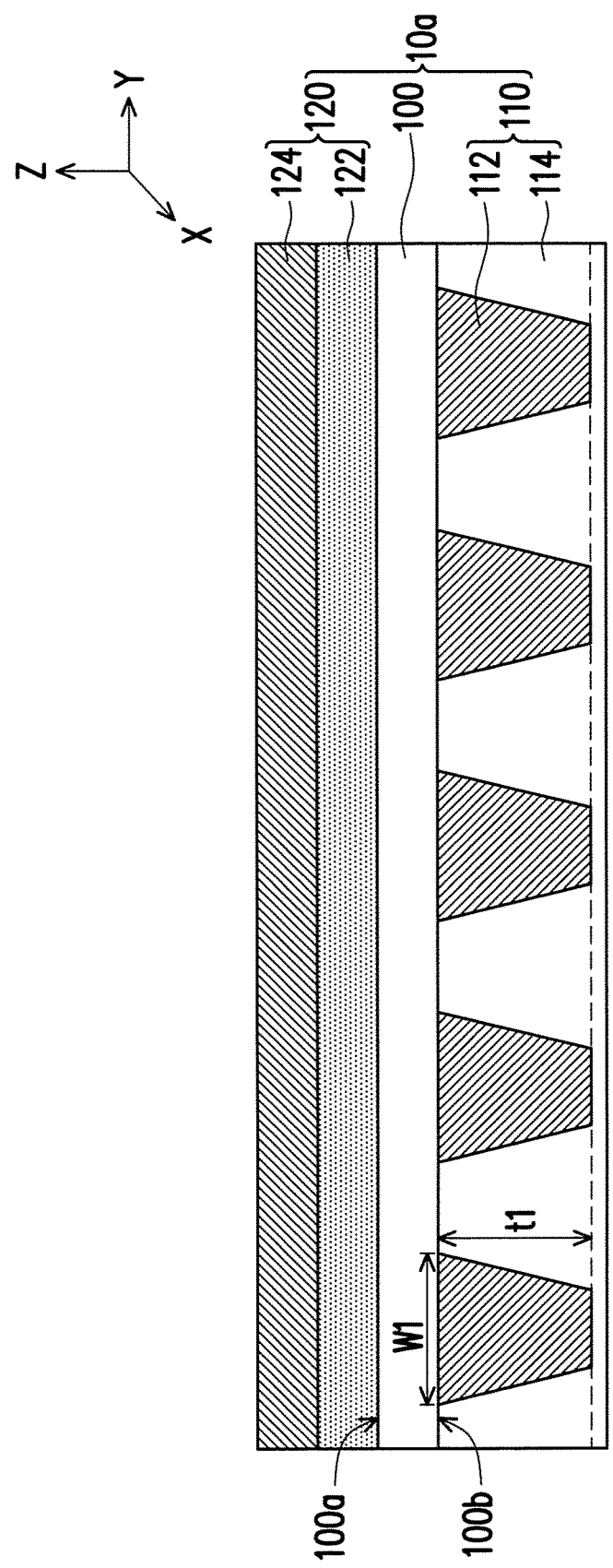
FIG. 1A, FIG. 5A, FIG. 7A to FIG. 7F, and FIG. 9A to FIG. 9G are schematic cross-sectional views of several protective structures respectively including a first substrate according to some embodiments of the disclosure.
Figure 2A:
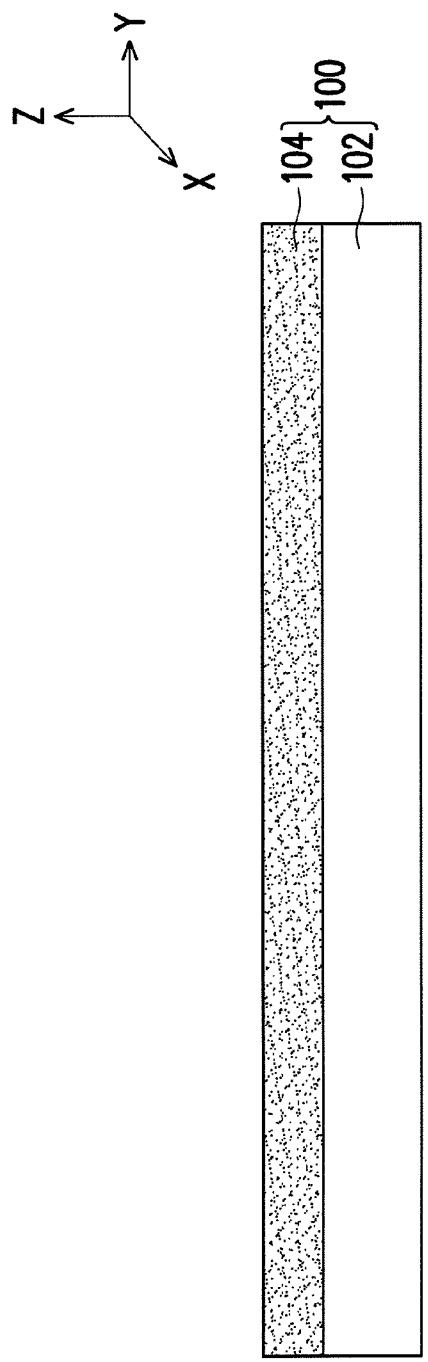
Figure 2B:
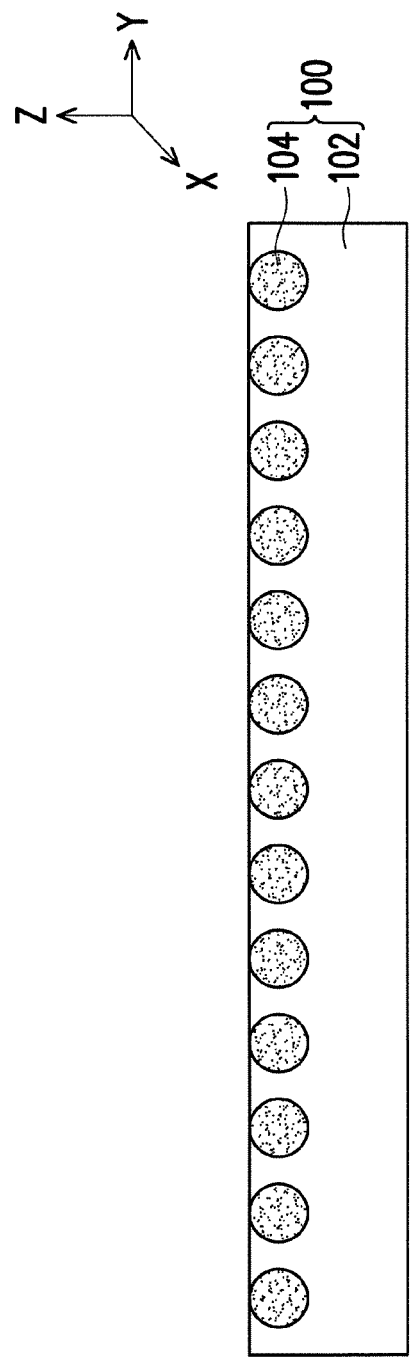
Figure 3A:
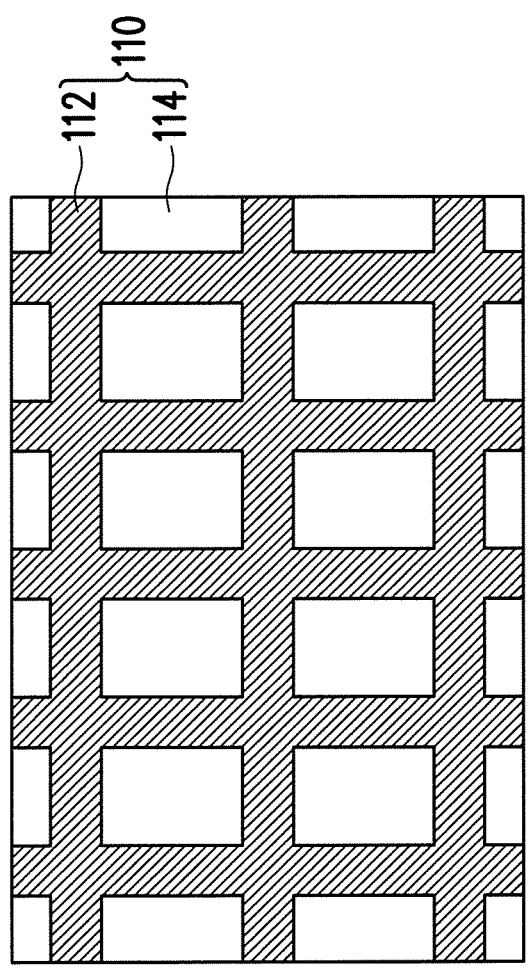
FIG. 3A to FIG. 3C are schematic top views of buffer structures and filling structures according to some embodiments of the disclosure.
Figure 3B:
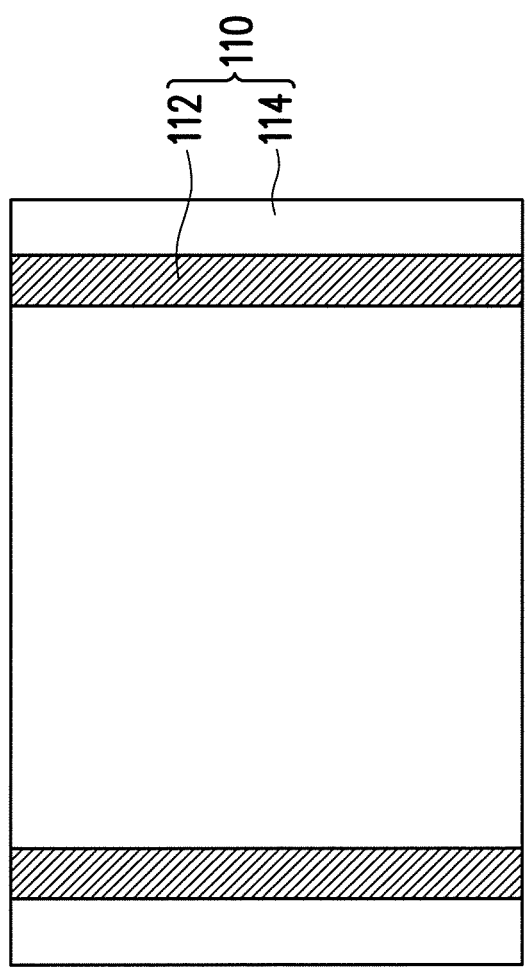
Figure 3C:
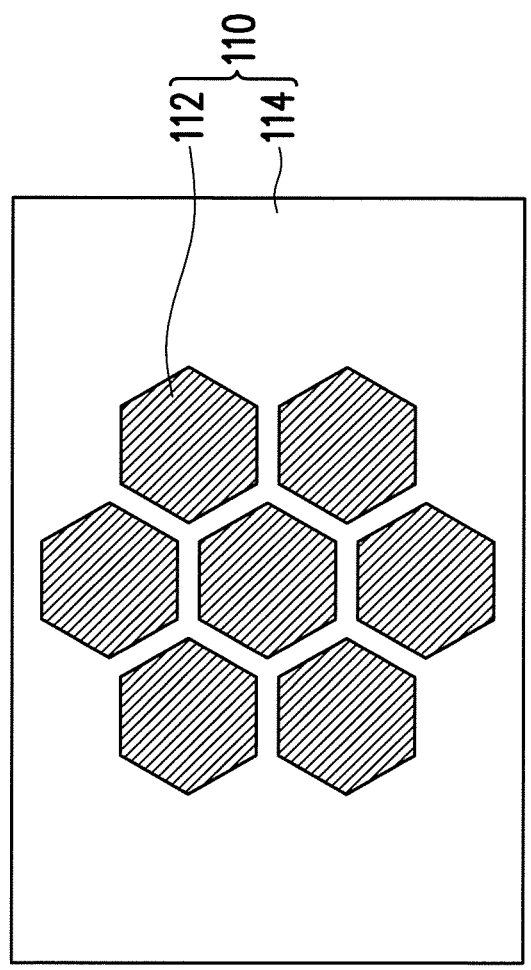

FIG. 1A is a schematic cross-sectional view of a protective structure that includes a first substrate 100 according to an embodiment of the disclosure. FIG. 2A to FIG. 2E are schematic cross-sectional views of several first substrates 100 according to several embodiments of the disclosure. FIG. 3A to FIG. 3C are schematic top views of buffer structures and filling structures according to some embodiments of the disclosure.

Referring to FIG. 1A, a protective structure 10a according to an embodiment of the disclosure includes the first substrate 100, an impact resistant structure 110, and an anti-scratch structure 120.

In an embodiment, the first substrate 100 is a single-material substrate formed of a pure organic material, for example. In another embodiment, referring to FIG. 2A to FIG. 2E, the first substrate 100 is a composite substrate or a hybrid substrate that includes an organic material 102 and an inorganic material 104. In another embodiment, the first substrate 100 may be a composite substrate or a hybrid substrate that includes organic material, or the first substrate 100 may be a composite substrate or a hybrid substrate that includes inorganic material. The first substrate 100 has a first surface 100a and a second surface 100b opposite to each other. In other words, referring to FIG. 2A, the organic material 102 and the inorganic material 104 may be continuous layers respectively. The layer formed of the inorganic material 104 is stacked on the layer formed of the organic material 102. Alternatively, referring to FIG. 2B to FIG. 2E, the inorganic material 104 is discontinuously dispersed on a side of (FIG. 2B) or inside (FIG. 2C) the organic material 102. The inorganic material 104 may be uniformly arranged in a row (FIG. 2B and FIG. 2C), a plurality of rows, or an array. The inorganic material 104 may also be non-uniformly dispersed in the organic material 102 (FIG. 2D).

The organic material 102 is polyimide (PI), poly(methyl methacrylate) (PMMA), polycarbonate (PC), polyethersulfone (PES), polyamide (PA), polyethylene terephthalate (PET), poly(ether ether ketone) PEEK, polyethylene naphthalate (PEN), polyethylenimine (PEI), polyurethane (PU), polydimethylsiloxane (PDMS), acrylic, a polymer containing ether, a polyolefin, or a combination of the foregoing, for example, but not limited thereto. The inorganic material 104 is silica, alumina, titanic oxide, or a combination of the foregoing, for example, but not limited thereto.

Referring to FIG. 1A, the anti-scratch structure 120 is located on the first surface 100a of the first substrate 100. The anti-scratch structure 120 includes a hard coat layer 122 and a surface anti-scratch layer 124. The hard coat layer 122 is located on the first surface 100a of the first substrate 100. The surface anti-scratch layer 124 is located on the hard coat layer 122. The surface anti-scratch layer 124 and the hard coat layer 122 are unpatterned layers respectively. In other words, the hard coat layer 122 covers the first surface 100a of the first substrate 100 completely, and the surface anti-scratch layer 124 covers the hard coat layer 122 completely. The hard coat layer 122 includes pentaerythritol tri(meth)acrylate, an acrylate, or a combination of the foregoing. A thickness of the hard coat layer 122 is in a range of 100 angstroms to 100,000 angstroms, for example. The surface anti-scratch layer 124 includes diamond-like carbon (DLC), silicon nitride, or a combination of the foregoing. A thickness of the surface anti-scratch layer 124 is in a range of 10 angstroms to 10,000 angstroms, for example.

Referring to FIG. 1A, the impact resistant structure 110 is located on the second surface 100b of the first substrate 100. The impact resistant structure 110 includes a plurality of buffer structures 112 and a plurality of filling structures 114. The buffer structures 112 cover a portion of the second surface 100b of the first substrate 100. Widths W1 of the buffer structures 112 may be the same as or different from one another. A distribution density of the buffer structures 112 in a central region and a distribution density of the buffer structures 112 in a peripheral region may be the same or different. A thickness t1 of the buffer structures 112 is in a range of 1000 angstroms to 1,000,000 angstroms, for example.

In addition, referring to FIG. 3A, in an embodiment, the buffer structures 112 may be a connected structure, such as a mesh structure. Referring to FIG. 3B and FIG. 3C, in another embodiment, the buffer structures 112 may be structures that are not connected with one another, which respectively have a strip shape (FIG. 3B), a block shape (FIG. 3C), or a combination of the foregoing, for example. A cross section of the buffer structure 112 may have a rectangular shape, a trapezoidal shape, an inverted trapezoidal shape, or a combination of the foregoing.

Referring to FIG. 1A again, the filling structures 114 cover the second surface 100b of the first substrate 100, which is not covered by the buffer structures 112. In an embodiment, referring to FIG. 1A, the filling structures 114 are located around two sides of the buffer structures 112 and do not extend to bottoms of the buffer structures 112. In another embodiment, the filling structures 114 are located on two sides of the buffer structures 112 and extend to the bottoms of the buffer structures 112. In other words, referring to FIG. 1A, in an embodiment, the filling structures 114 are coplanar with the bottoms of the buffer structures 112. That is, the filling structures 114 and the bottoms of the buffer structures 112 (as indicated by the dotted line) are both exposed. In another embodiment, the bottoms of the buffer structures 112 are covered by the filling structures 114 (as indicated by the solid line). A thickness of the filling structures 114 is in a range of 1000 angstroms to 2,000,000 angstroms, for example.

In addition, referring to FIG. 1A, in an embodiment, the following order, i.e., the surface anti-scratch layer 124, the hard coat layer 122, the first substrate 100, the buffer structures 112, and the filling structures 114, is based on a descending order of the Young's moduli thereof. In some exemplary embodiments, the Young's modulus of the surface anti-scratch layer 124 is greater than the Young's modulus of the hard coat layer 122 by 10 GPa or more; the Young's modulus of the hard coat layer 122 is greater than the Young's modulus of the first substrate 100 by 0.5 GPa or more; the Young's modulus of the first substrate 100 is greater than the Young's modulus of the buffer structures 112 by 0.2 GPa or more; and the Young's modulus of the buffer structures 112 is greater than the Young's modulus of the filling structures 114 by 0.1 GPa or more. In some other exemplary embodiments, the Young's modulus of the surface anti-scratch layer 124 is 1.5 times greater than the Young's modulus of the hard coat layer 122 or more; the Young's modulus of the hard coat layer 122 is 1.1 times greater than the Young's modulus of the first substrate 100 or more; the Young's modulus of the first substrate 100 is 1.05 times greater than the Young's modulus of the buffer structures 112 or more; and the Young's modulus of the buffer structures 112 is 1.02 times greater than the Young's modulus of the filling structures 114 or more.

In an embodiment, the buffer structures 112 and the filling structures 114 are formed of different materials. The buffer structures 112 include a resin, a polymer, a photoresist, or a combination of the foregoing. The filling structures 114 include a resin, a polymer, a photoresist, or a combination of the foregoing.

Referring to FIG. 1A, the buffer structures 112, the filling structures 114, the hard coat layer 122, and the surface anti-scratch layer 124 may be formed by any known method, such as coating, printing, chemical vapor deposition, and so on. In an embodiment, the impact resistant structure 110 is formed first, and then the anti-scratch structure 120 is formed. In an exemplary embodiment, the second surface 100b of the first substrate 100 is arranged upward and then the buffer structures 112 are formed on a portion of the second surface 100b of the first substrate 100 by printing. Thereafter, the filling structures 114 are formed on the second surface 100b of the first substrate 100, which is not covered by the buffer structures 112, and around two sides of the buffer structures 112, or further cover tops of the buffer structures 112 (i.e. the bottoms of the buffer structures 112 in FIG. 1A) by coating. Then, the first substrate 100 is flipped over to put the first surface 100a upward. Next, the hard coat layer 122 is formed on the first surface 100a of the first substrate 100 by coating, and then the surface anti-scratch layer 124 is formed on the hard coat layer 122 by chemical vapor deposition. In another embodiment, the anti-scratch structure 120 is formed first, and then the impact resistant structure 110 is formed.

Figure 1B:
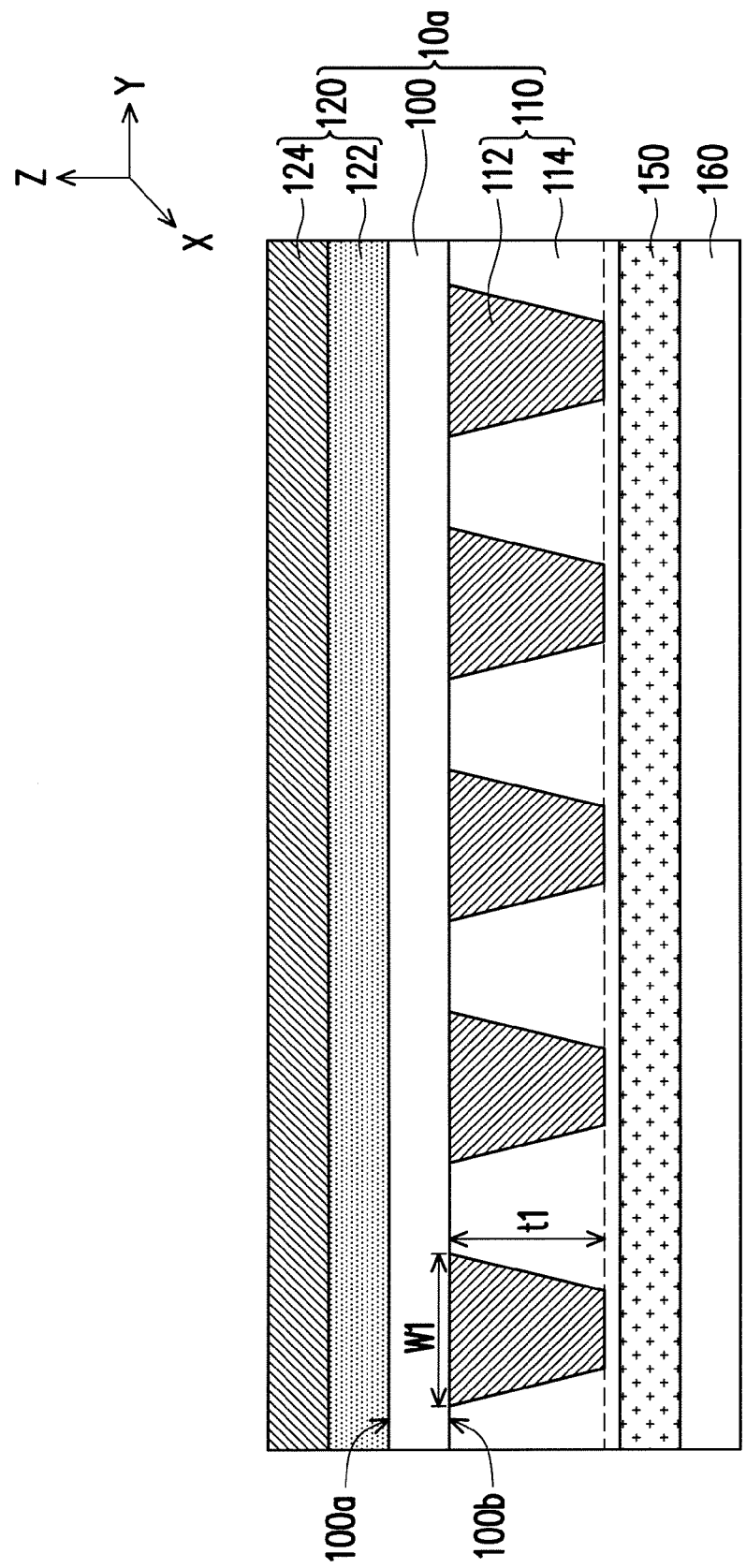
FIG. 1B to FIG. 1D, FIG. 5B to FIG. 5D, FIG. 7G, FIG. 7H, and FIG. 9H are schematic cross-sectional views of several electronic apparatuses according to some embodiments of the disclosure, in which the protective structure includes the first substrate.
Figure 1C:
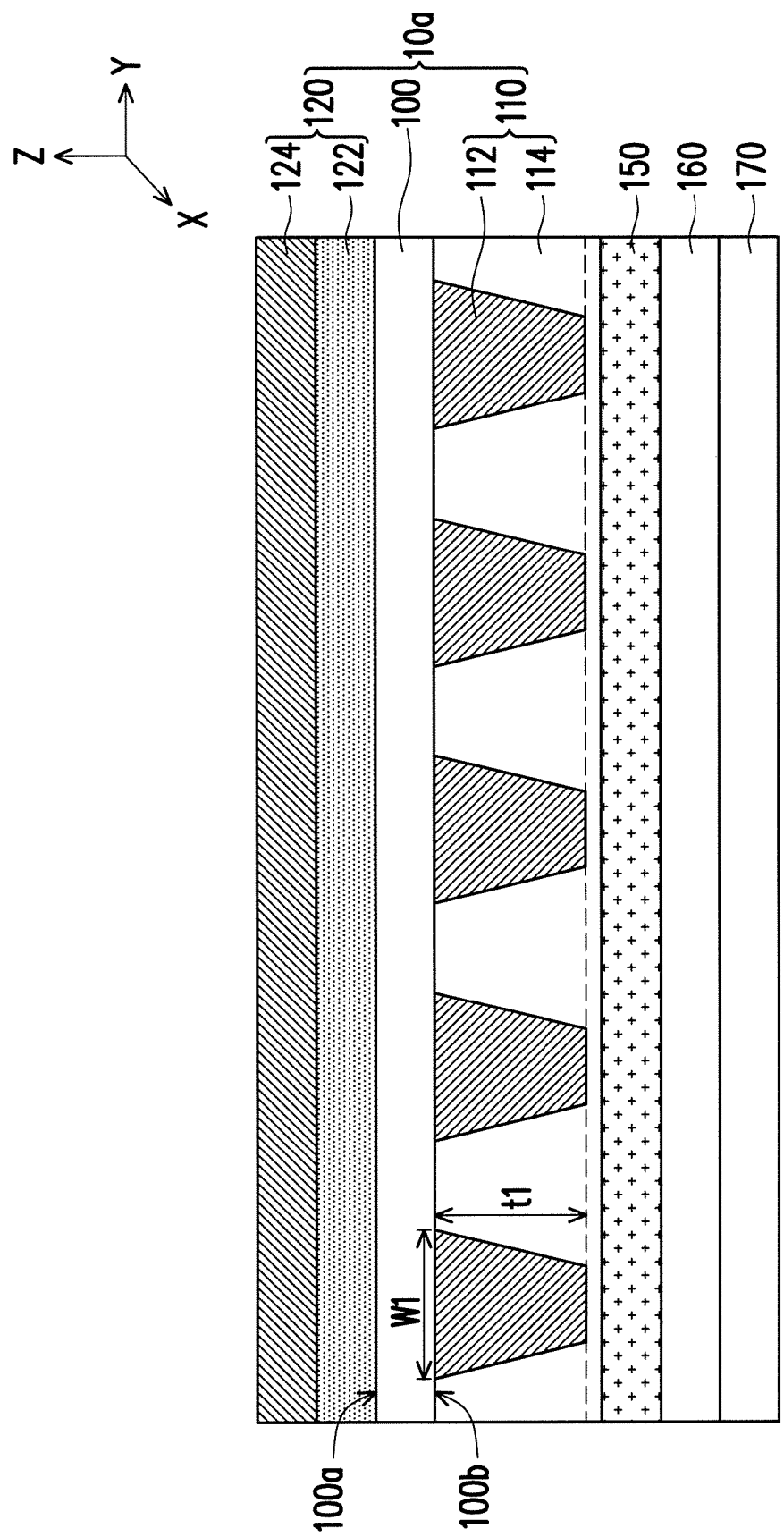
Figure 1D:
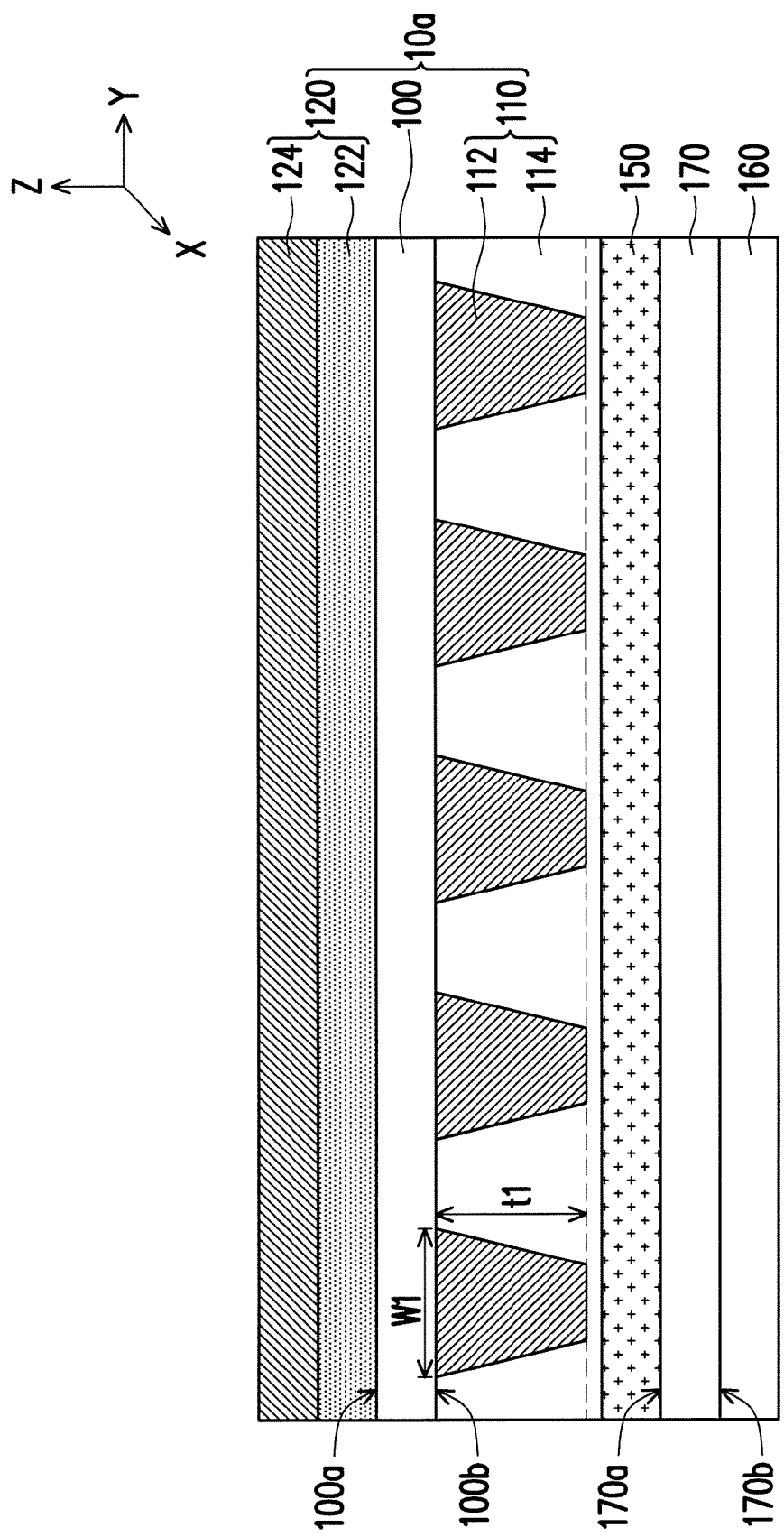

FIG. 1B to FIG. 1D are schematic cross-sectional views of several electronic apparatuses according to some embodiments of the disclosure, in which the protective structure includes the first substrate 100.

Referring to FIG. 1B, in some embodiments, the protective structure 10a is attached to an electronic device 160 through an adhesive layer 150. In some other embodiments, referring to FIG. 1C, the protective structure 10a is attached to the electronic device 160 on a second substrate 170 through the adhesive layer 150. In some other embodiments, referring to FIG. 1D, the electronic device 160 is located on a second surface 170b of the second substrate 170. The protective structure 10a may also be attached to a first surface 170a of the second substrate 170 through the adhesive layer 150.

A material of the adhesive layer 150 includes a resin film, an optical clear adhesive (OCA), a hot-melt adhesive, an optical pressure sensitive adhesive (PSA), or an optical pressure sensitive resin (OCR), for example. The electronic device 160 includes a wire, an electrode, a resistor, an inductor, a capacitor, a transistor, a diode, a switch device, an amplifier, a processor, a controller, a thin film transistor, a touch device, a pressure sensing device, a MEMS device, a feedback device, a display, or other suitable electronic devices, for example. In some embodiments, the electronic device 160 may be an optical device or a device with a light filter layer.

The second substrate 170 is a transparent substrate or an opaque substrate, for example. The second substrate 170 may be a flexible substrate or a rigid substrate. The transparent substrate is glass, plastic, acrylic, or polydimethylsiloxane (PDMS), for example.

Figure 4A:
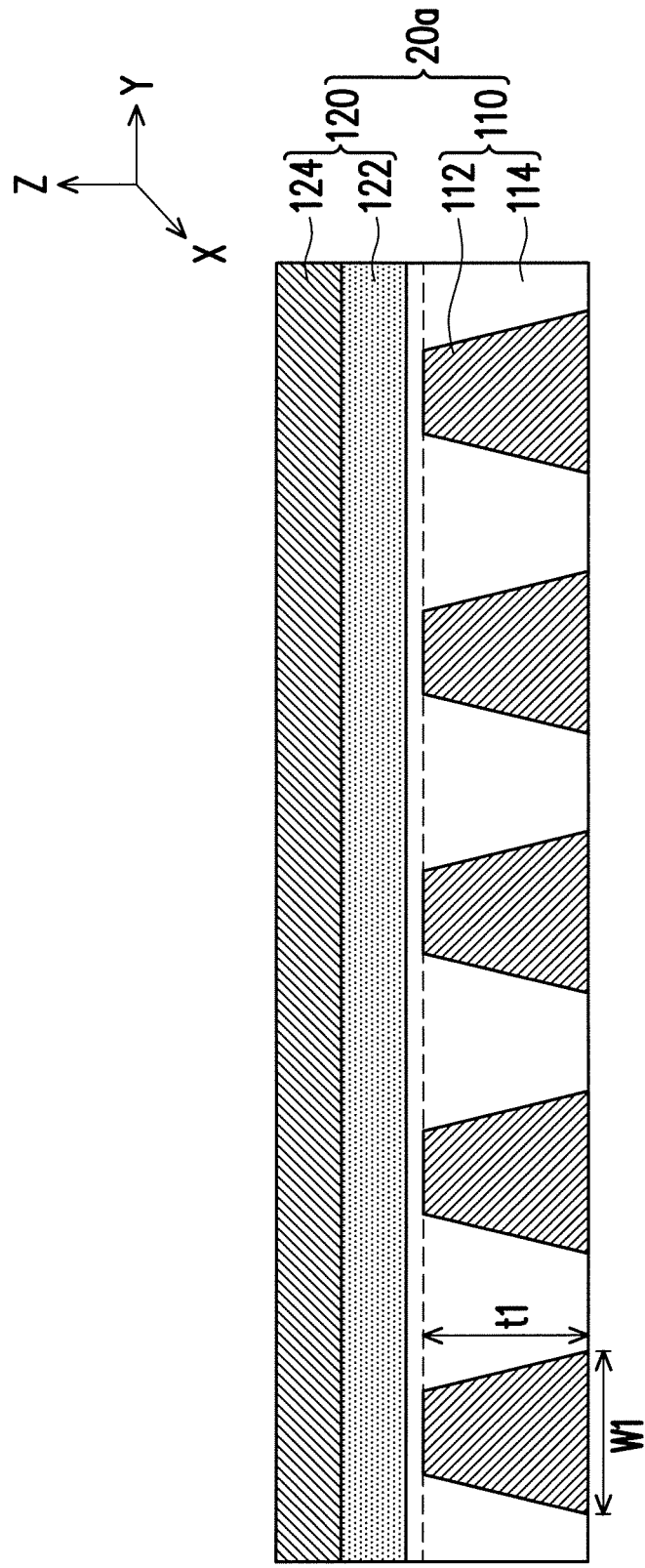
FIG. 4A is a schematic cross-sectional view of the protective structure not including the first substrate according to some embodiments of the disclosure.
Figure 4B:
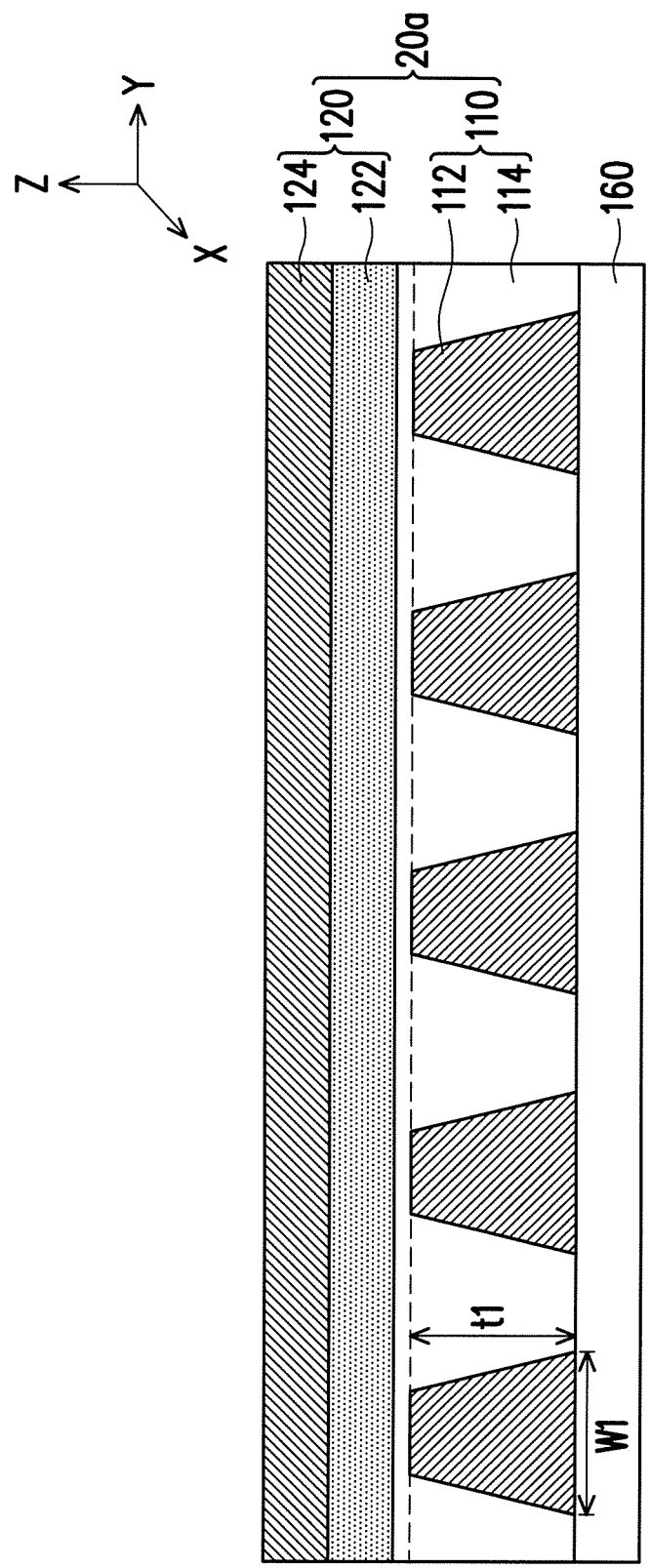
FIG. 4B to FIG. 4D, FIG. 8A, FIG. 8B, FIG. 10A, and FIG. 10B are schematic cross-sectional views of several electronic apparatuses according to some embodiments of the disclosure, in which the protective structure does not include the first substrate.
Figure 4C:
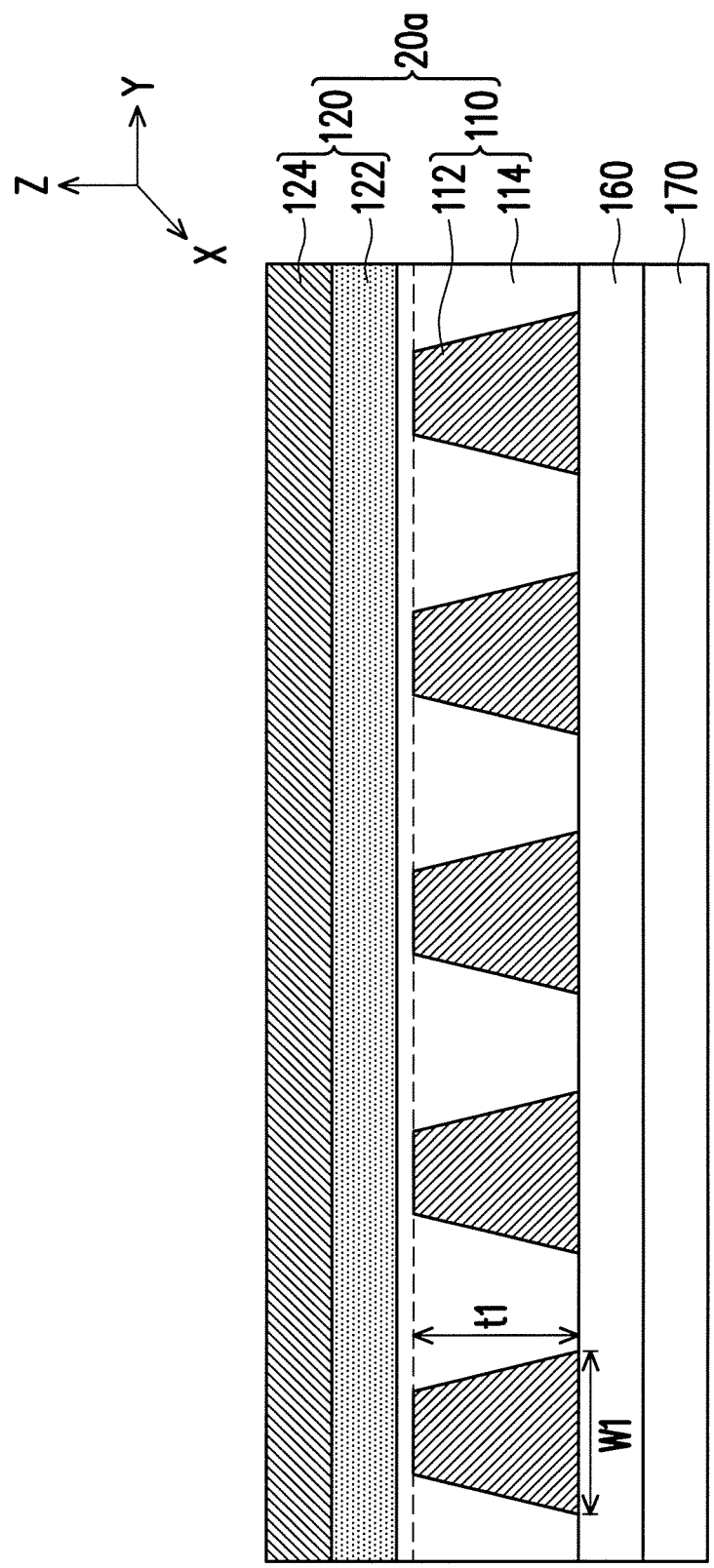
Figure 4D:
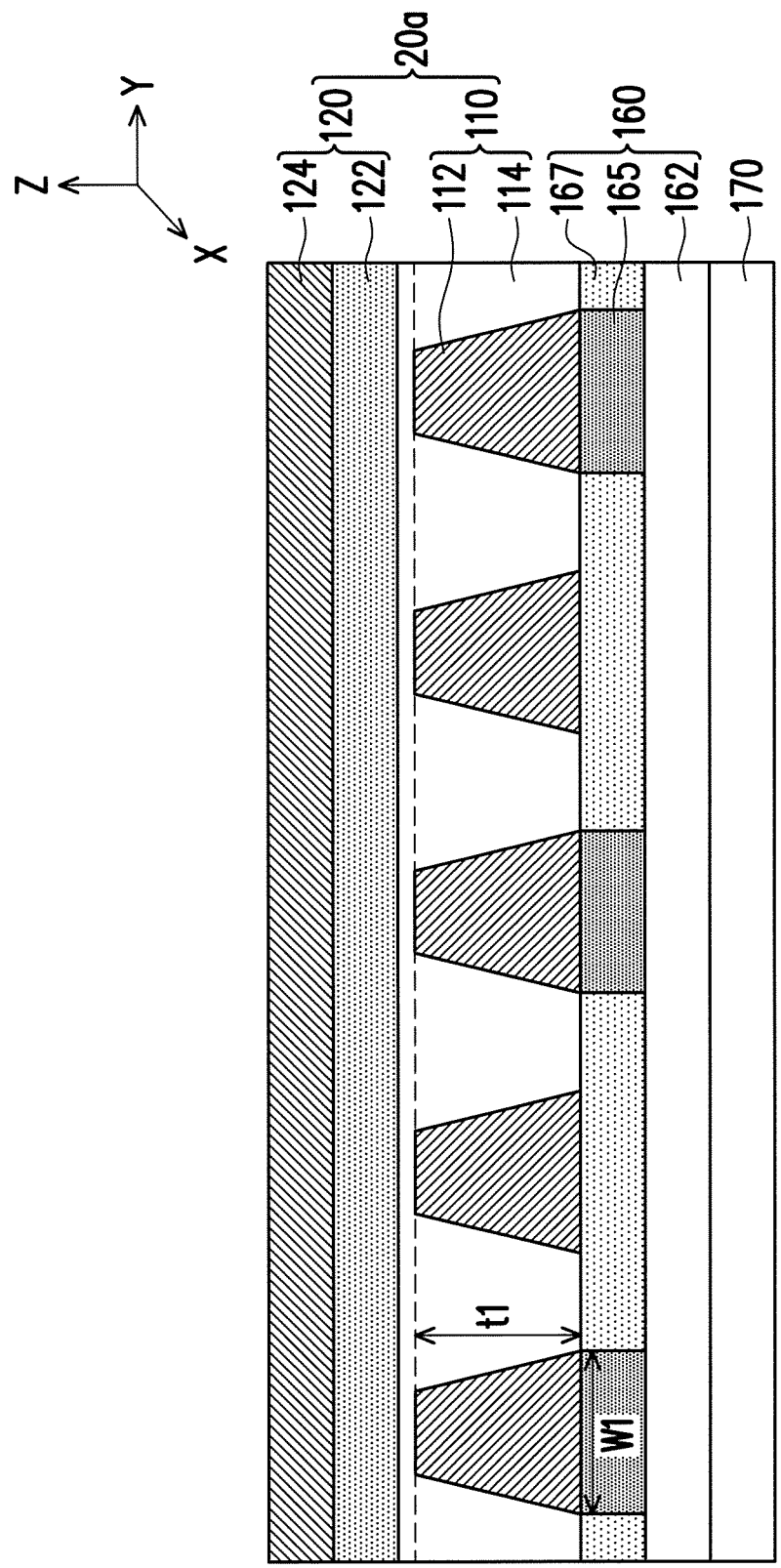

FIG. 4A is a schematic cross-sectional view of a protective structure that does not include the first substrate 100 according to an embodiment of the disclosure. FIG. 4B to FIG. 4D are schematic cross-sectional views of several electronic apparatuses according to some embodiments of the disclosure, in which the protective structure does not include the first substrate 100.

Referring to FIG. 4A, a protective structure 20a according to an embodiment of the disclosure includes the impact resistant structure 110 and the anti-scratch structure 120, but does not include the first substrate 100. In other words, the impact resistant structure 110 and the anti-scratch structure 120 are in direct contact. Referring to FIG. 4B, in some embodiments, the protective structure 20a is directly formed on the electronic device 160 without the adhesive layer therebetween. Referring to FIG. 4C, in some other embodiments, the protective structure 20a is directly formed on the electronic device 160 on the second substrate 170.

In other embodiments, referring to FIG. 4D, the protective structure 20a is directly formed on the electronic device 160 on the second substrate 170. The electronic device 160 may be a flexible electronic device. The electronic device 160 is a display device, which includes a display driving circuit layer 162, a plurality of display regions 165, and a plurality of non-display regions 167, for example. The display regions 165 and the non-display regions 167 are located on the display driving circuit layer 162. The non-display regions 167 are located beside the display regions 165. The buffer structures 112 may be located on the display regions 165 and the non-display regions 167 to be in contact with the display regions 165 and the non-display regions 167.

The protective structure 20a is directly formed on the electronic device 160 on the second substrate 170 without the adhesive layer therebetween. Take FIG. 4D as an example, the impact resistant structure 110 is formed on the electronic device 160 on the second substrate 170 first. In some embodiments, a method of forming the impact resistant structure 110 includes forming the buffer structures 112 on the display regions 165 and the non-display regions 167, and then filling the filling structures 114 in the gaps between the buffer structures 112. The filling structures 114 may cover upper surfaces of the buffer structures 112 or not (as indicated by the dotted line). Thereafter, the anti-scratch structure 120 is formed on the impact resistant structure 110. The anti-scratch structure 120 may be formed by forming the hard coat layer 122 on the impact resistant structure 110 and then forming the surface anti-scratch layer 124 thereon.

In a word, the protective structure of the embodiments of the disclosure may include the first substrate 100 as shown in FIG. 1A or not include the first substrate 100 as shown in FIG. 4A. Likewise, the protective structures of the following embodiments may include the first substrate 100 as described above.

Figure 5A:
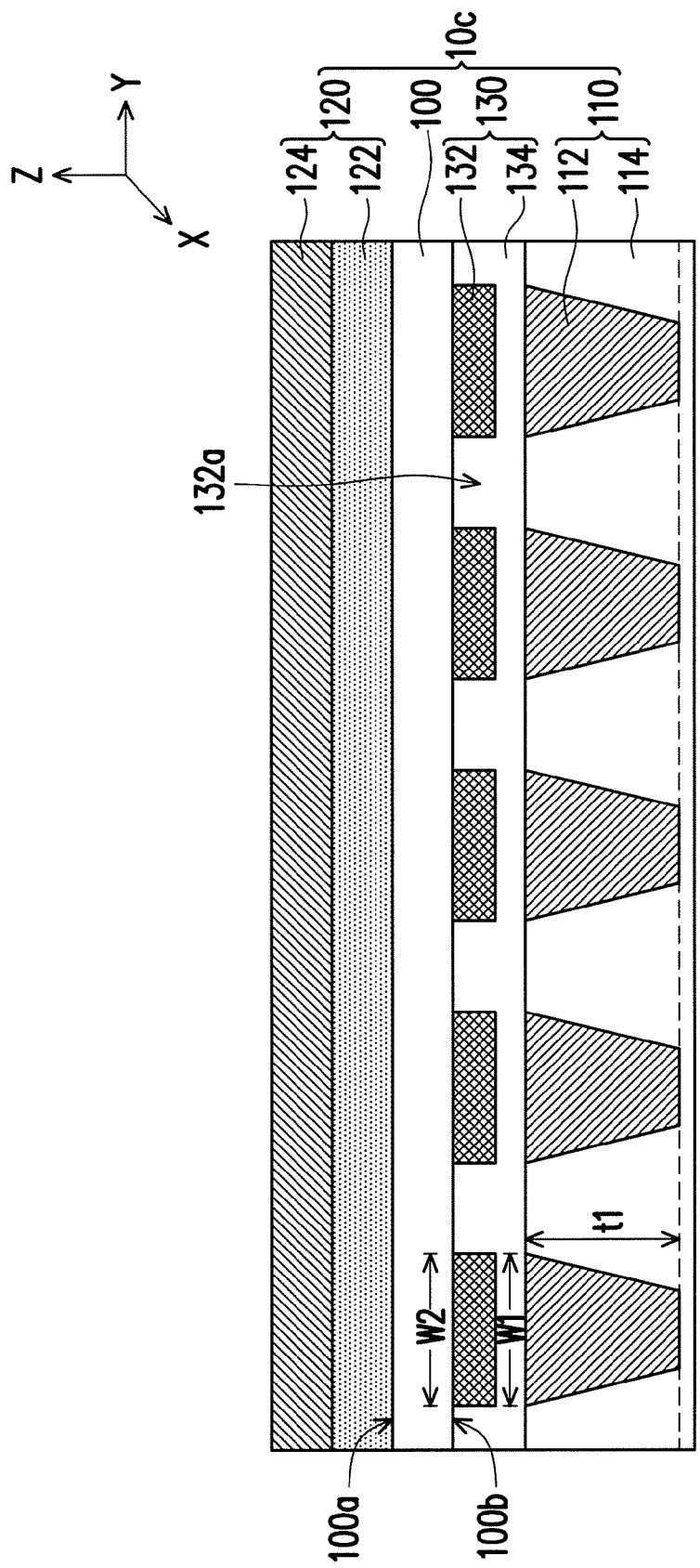

FIG. 5A is a schematic cross-sectional view of the protective structure according to another embodiment of the disclosure, in which the protective structure includes the first substrate 100.

Referring to FIG. 5A, a protective structure 10c according to another embodiment of the disclosure further includes a light filter structure 130. That is, the protective structure 10c includes the anti-scratch structure 120, the first substrate 100, the light filter structure 130, and the impact resistant structure 110. Details of the first substrate 100, the impact resistant structure 110, and the anti-scratch structure 120 have been specified above and thus are not repeated hereinafter.

The light filter structure 130 is located between the second surface 100b of the first substrate 100 and the impact resistant structure 110. The light filter structure 130 includes a plurality of light filter layers 132 and a planar layer 134. The light filter layers 132 are located on the second surface 100b of the first substrate 100. The planar layer 134 is located on the second surface 100b of the first substrate 100 and filled into a plurality of first opening regions 132a of the light filter layers 132. In some embodiments, at least one of the light filter layers 132 is disposed corresponding to one of the buffer structures 112. In some exemplary embodiments, each of the light filter layers 132 is disposed corresponding to one buffer structure 112. In some other exemplary embodiments, each of the light filter layers 132 is disposed corresponding to more than one buffer structure 112. In other words, the light filter layers 132 and the buffer structures 112 may be disposed on a one-to-one basis or a one-to-many basis. In some embodiments, a width W2 of the light filter layer 132 is greater than or equal to the width W1 of the buffer structure 112. In other words, the width W1 of the buffer structure 112 does not extend to the first opening region 132a between adjacent two light filter layers 132.

Figure 6A:
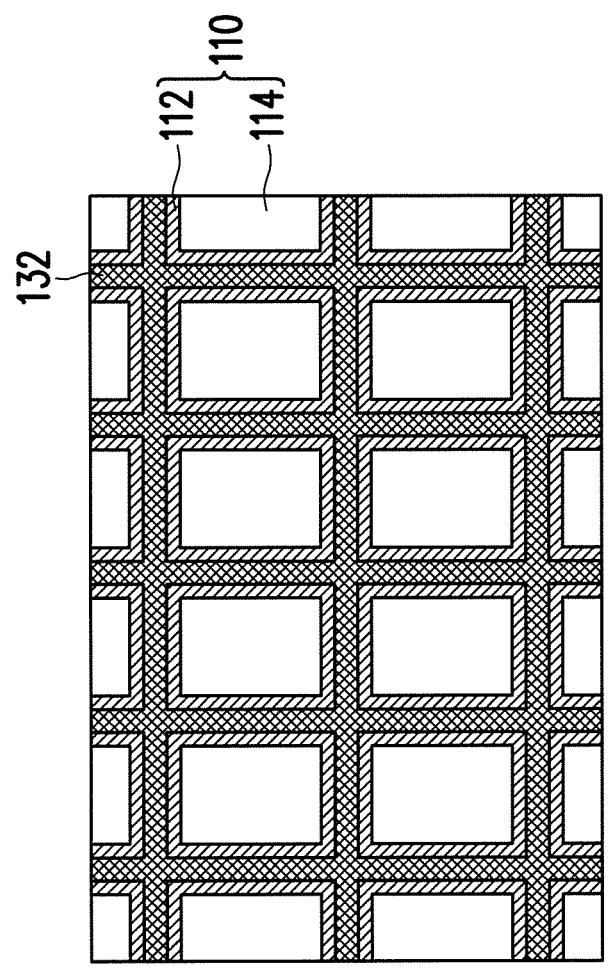
FIG. 6A to FIG. 6C are schematic top views of light filter layers, buffer structures, and filling structures according to some embodiments of the disclosure.
Figure 6B:
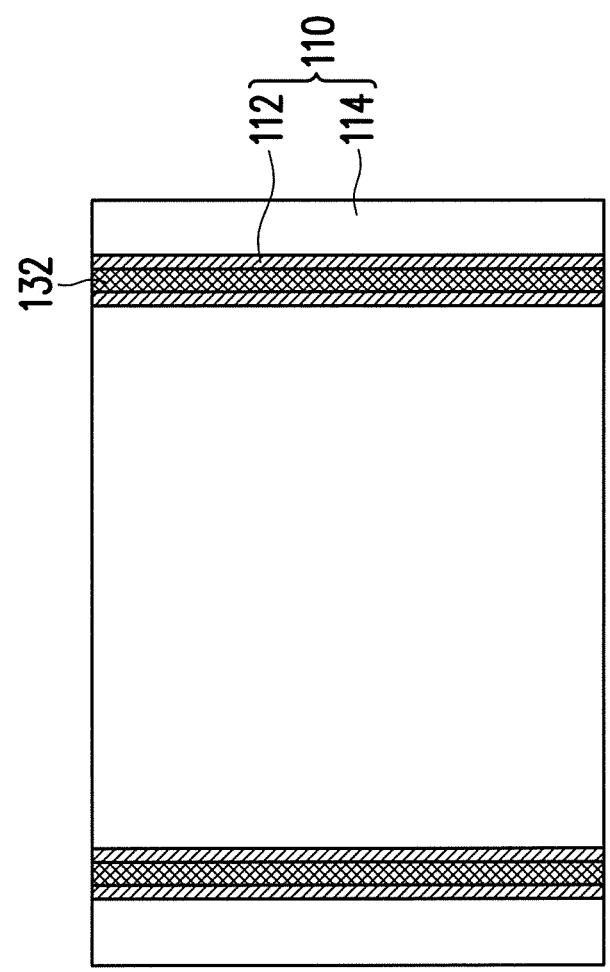
Figure 6C:
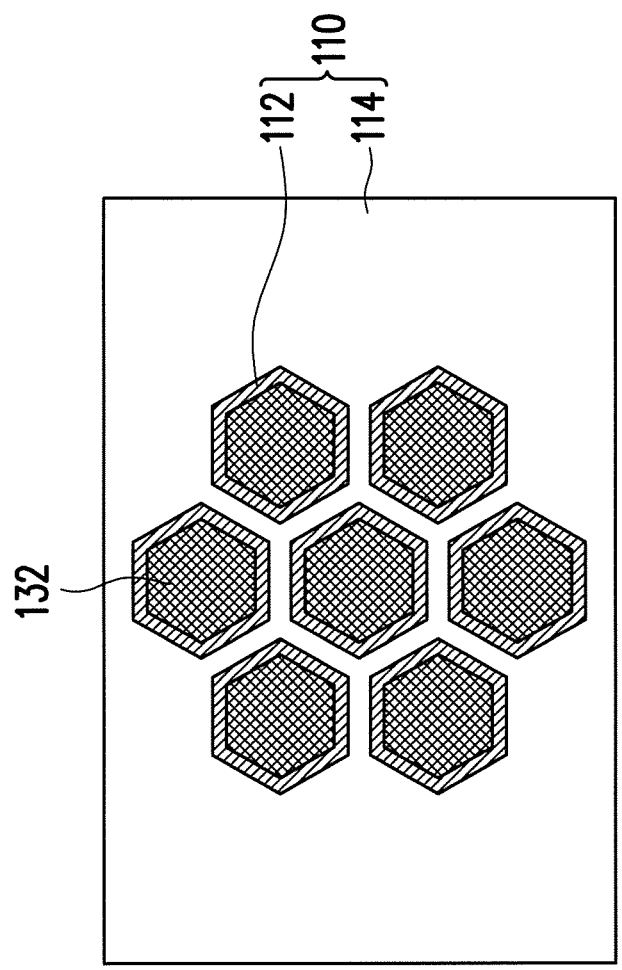

FIG. 6A to FIG. 6C are schematic top views of the light filter layers, the buffer structures, and the filling structures according to several embodiments of the disclosure.

Referring to FIG. 6A, in an embodiment, the light filter layers 132 may be a connected structure, such as a mesh structure. Referring to FIG. 6B and FIG. 6C, in another embodiment, the light filter layers 132 may be structures that are not connected with one another, which respectively have a strip shape (FIG. 6B) or a block shape (FIG. 6C), for example. The shape of the light filter layers 132 may be the same as, similar to, or different from the shape of the buffer structures 112, and is not particularly limited.

In some embodiments, the light filter layers 132 may be black light filter layers, and an optical path thereof has an optical transmittance less than 30% in a Z axis. In some other embodiments, the light filter layers 132 may be color filter layers, and an optical path thereof has an optical transmittance of 70% to 98% in the Z axis; and an optical path of the planar layer 134 has an optical transmittance of 30% to 80% in the Z axis.

The light filter layer 132 may be an insulator, a semiconductor, a conductor, or a combination of the foregoing. The light filter layer 132 may be a single-layer film or a multi-layer film. The planar layer 134 may be a dielectric material layer, such as silicon oxide or spin-on glass (SOG).

In an embodiment, a method of forming the protective structure 10c is described as follows. The light filter structure 130 is formed on the second surface 100b of the first substrate 100 first. A method of forming the light filter structure 130 includes forming the light filter layers 132 on the second surface 100b of the first substrate 100, and then forming the planar layer 134 on the second surface 100b of the first substrate 100, which is not covered by the light filter layers 132, and filling the planar layer 134 into the first opening regions 132a of the light filter layers 132, or further to cover the tops of the light filter layers 132 (the bottoms of the light filter layers 132 in FIG. 3A), for example. Next, the impact resistant structure 110 is formed on the light filter structure 130. Thereafter, the first substrate 100 is flipped over, and the anti-scratch structure 120 is formed on the first surface 100a of the first substrate 100. In another embodiment, the anti-scratch structure 120 is formed on the first surface 100a of the first substrate 100 first, and then the first substrate 100 is flipped over and the light filter structure 130 and the impact resistant structure 110 are formed sequentially on the second surface 100b of the first substrate 100.

Figure 5B:
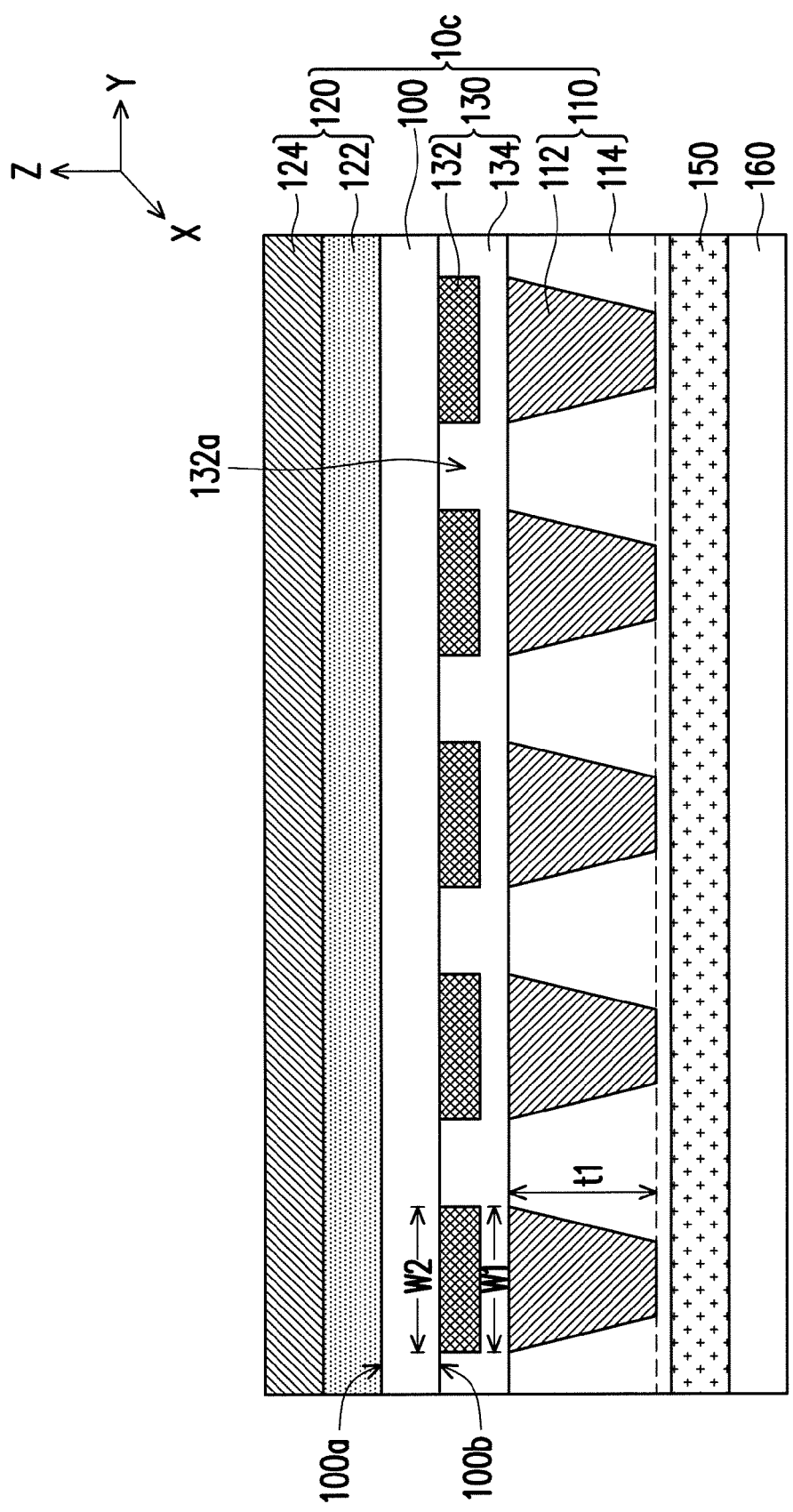
Figure 5C:
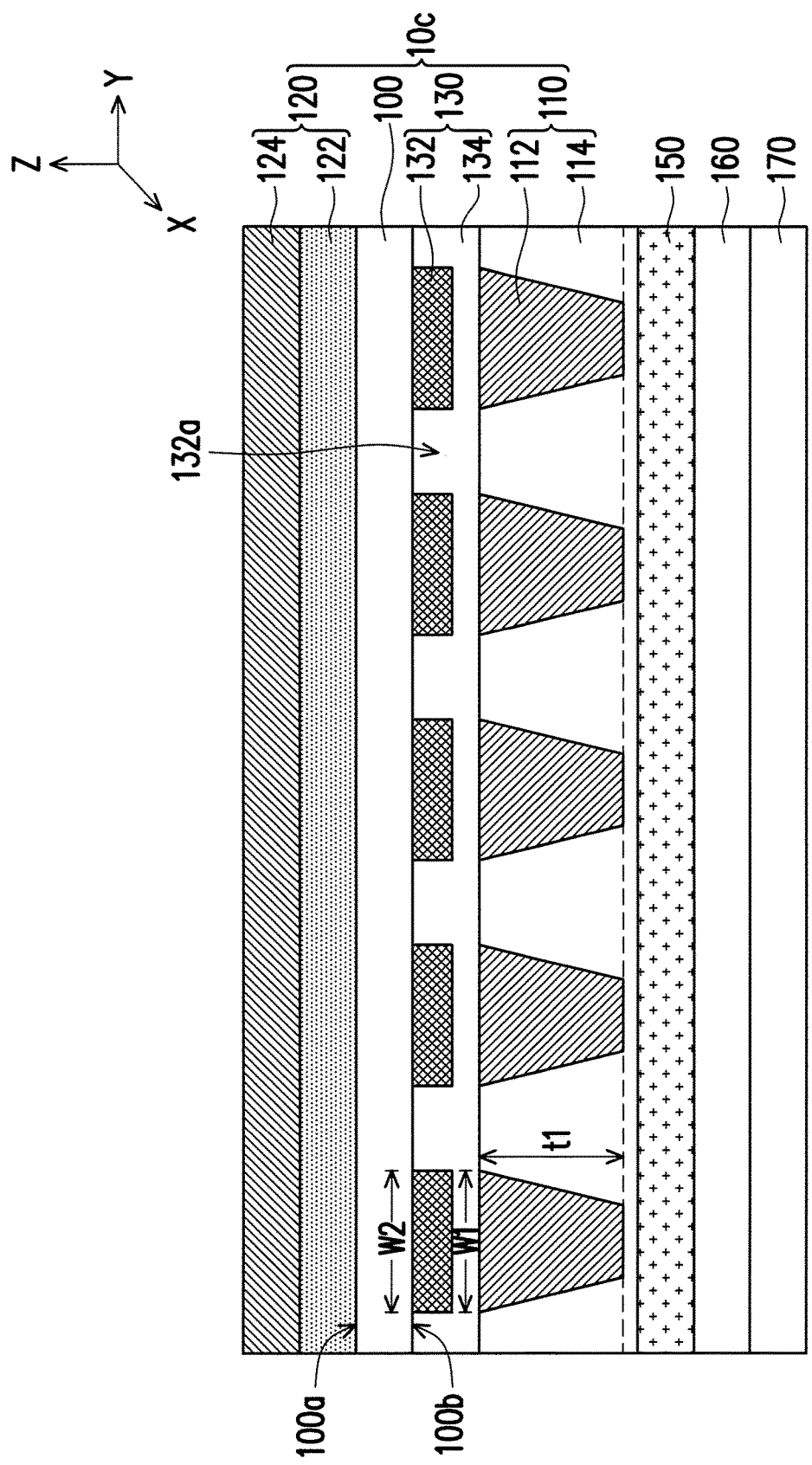
Figure 5D:
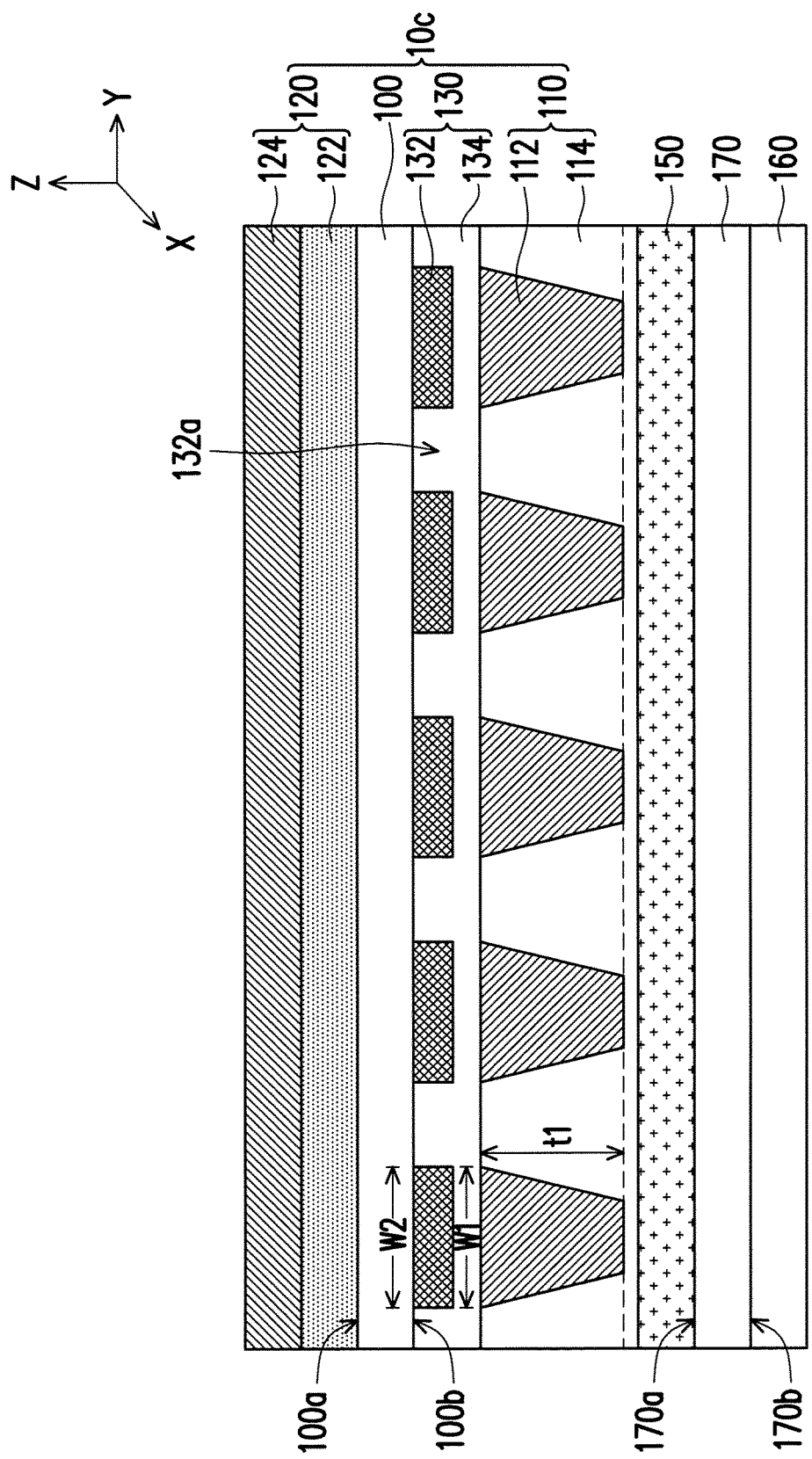

FIG. 5B to FIG. 5D are schematic cross-sectional views of several electronic apparatuses according to some embodiments of the disclosure.

Referring to FIG. 5B, in some embodiments, the protective structure 10b is attached to the electronic device 160 through the adhesive layer 150. In some other embodiments, referring to FIG. 5C, the protective structure 10b is attached to the electronic device 160 on the second substrate 170 through the adhesive layer 150. In other embodiments, referring to FIG. 5D, the electronic device 160 is located on the second surface 170b of the second substrate 170. The protective structure 10b may also be attached to the first surface 170a of the second substrate 170 through the adhesive layer 150.

In the above embodiments corresponding to FIG. 1A to FIG. 1D and FIG. 5A to FIG. 5D, the hard coat layer 122 and the surface anti-scratch layer 124 are unpatterned layers. However, in other embodiments, one of the hard coat layer 122 and the surface anti-scratch layer 124 is patterned layer. In yet another embodiments, the hard coat layer 122 and the surface anti-scratch layer 124 may both be patterned layers. For simplicity, in the following embodiment with reference to FIG. 7A to FIG. 7F, the hard coat layer 122 and the surface anti-scratch layer 124 of the embodiment of FIG. 5A are changed to patterned layers, for example.

FIG. 7A to FIG. 7F are schematic cross-sectional views of several protective structures according to some embodiments of the disclosure.

Figure 7A:
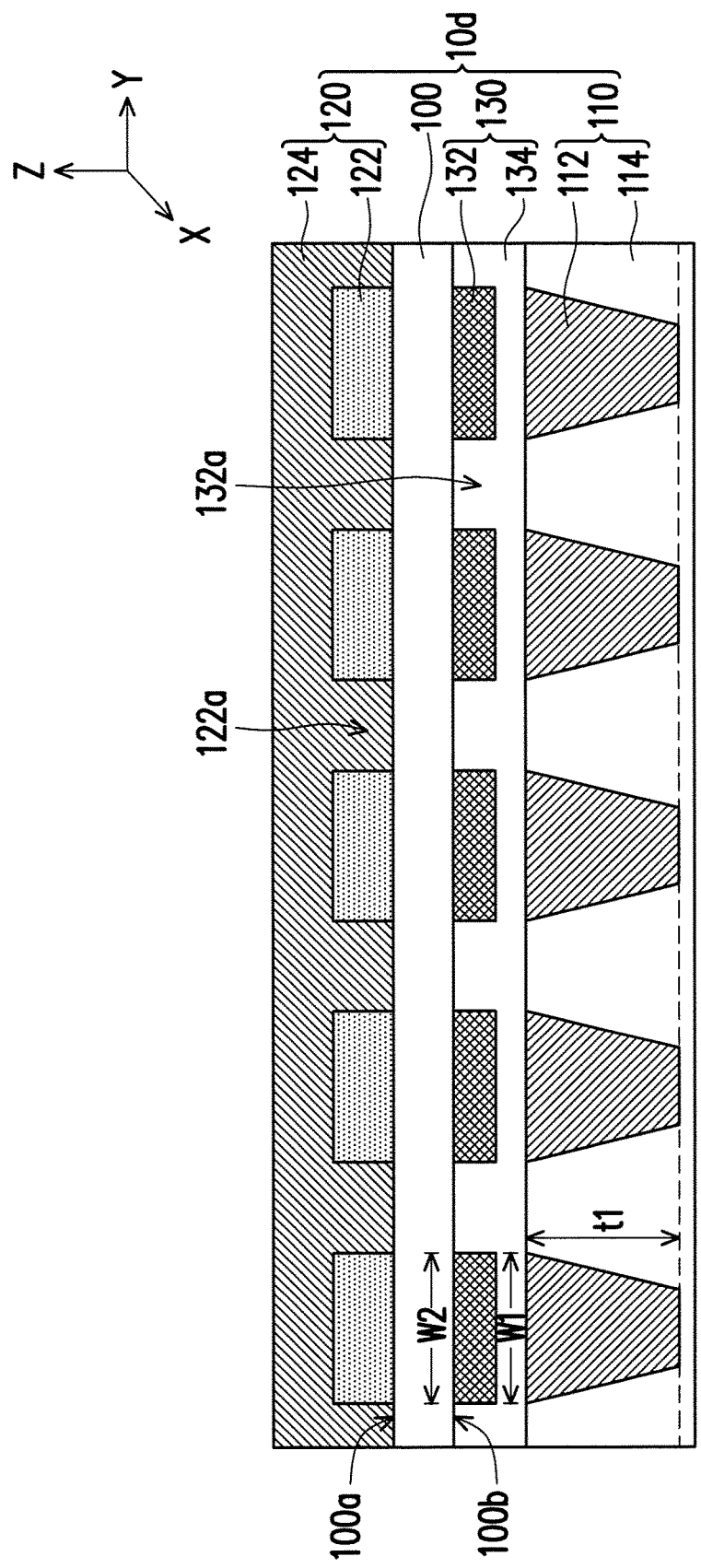

Referring to FIG. 7A, in a protective structure 10d, the hard coat layer 122 is a patterned layer, whereas the surface anti-scratch layer 124 is an unpatterned layer. The surface anti-scratch layer 124 is filled into a plurality of second opening regions 122a of the hard coat layer 122 and is a planar layer. The light filter structure 130 is selectively disposed. In an embodiment where the light filter structure 130 is disposed, the pattern of the hard coat layer 122 is the same as, similar to, or different from the pattern of the light filter layers 132. The second opening regions 122a of the hard coat layer 122 and the first opening regions 132a of the light filter layers 132 may overlap completely or partially. The second opening regions 122a and the first opening regions 132a may have the same or different sizes.

Figure 7B:
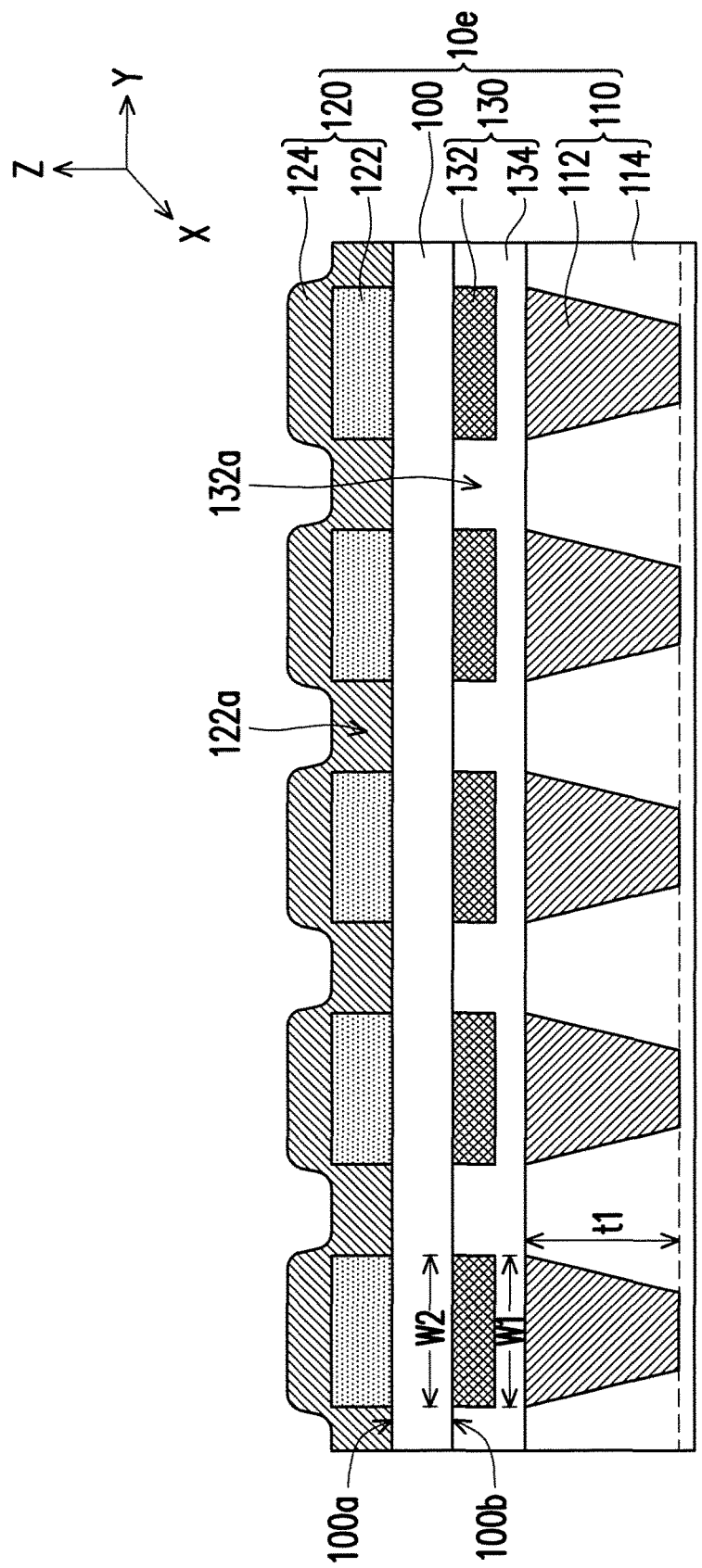

Referring to FIG. 7B, a protective structure 10e is similar to the embodiment of FIG. 7A, but in this embodiment, the surface anti-scratch layer 124 is filled into the second opening regions 122a of the hard coat layer 122 and is a conformal layer. The light filter structure 130 is selectively disposed.

Figure 7C:
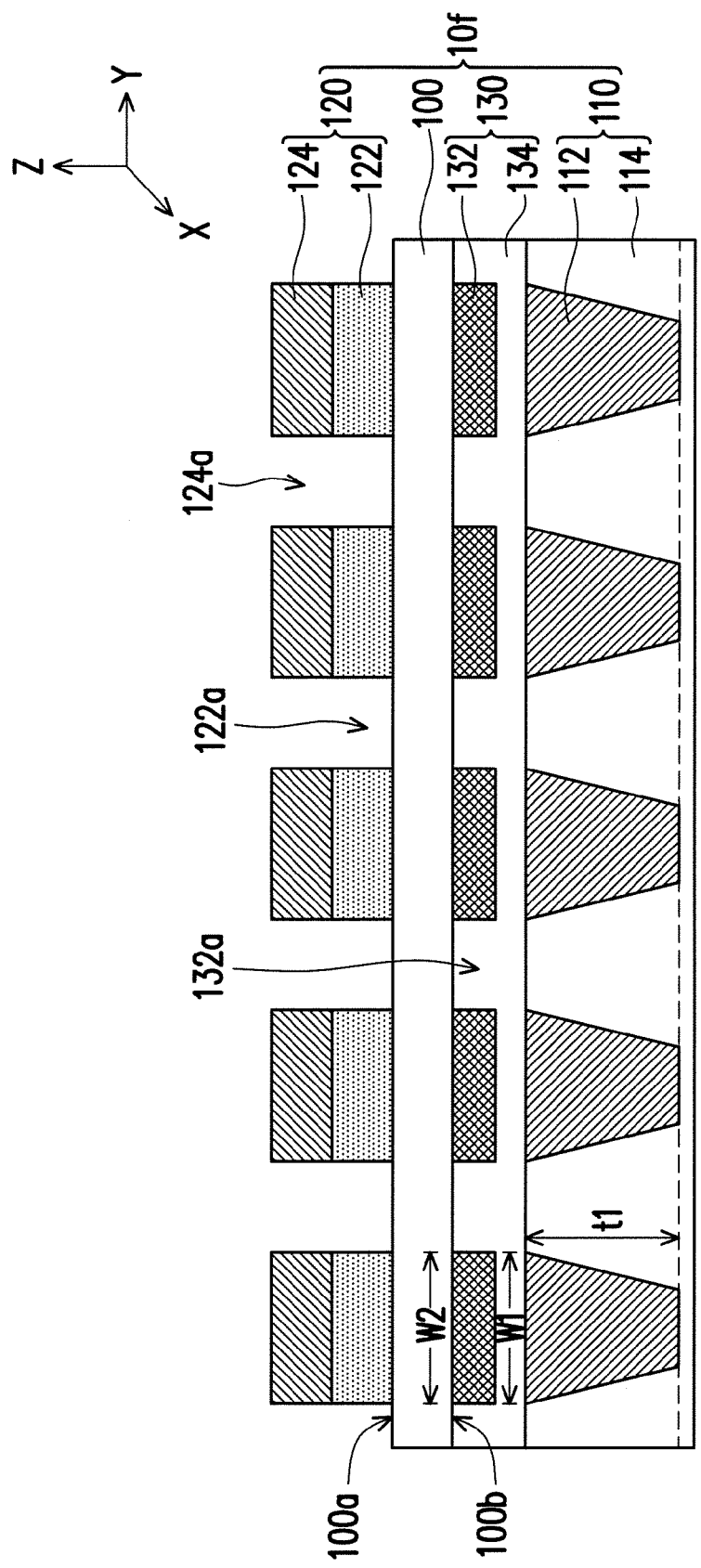

Referring to FIG. 7C, in a protective structure 10f, the hard coat layer 122 and the surface anti-scratch layer 124 are both patterned layers. The light filter structure 130 is selectively disposed. In an embodiment where the light filter structure 130 is disposed, the light filter layers 132, the surface anti-scratch layer 124, and the hard coat layer 122 may have the same, similar, or different patterns. The light filter layers 132 have the first opening regions 132a, the hard coat layer 122 has the second opening regions 122a, and the surface anti-scratch layer 124 has third opening regions 124a. The first opening regions 132a, the second opening regions 122a, and the third opening regions 124a may overlap completely or partially. The first opening regions 132a, the second opening regions 122a, and the third opening regions 124a may have the same or different sizes.

Figure 7D:
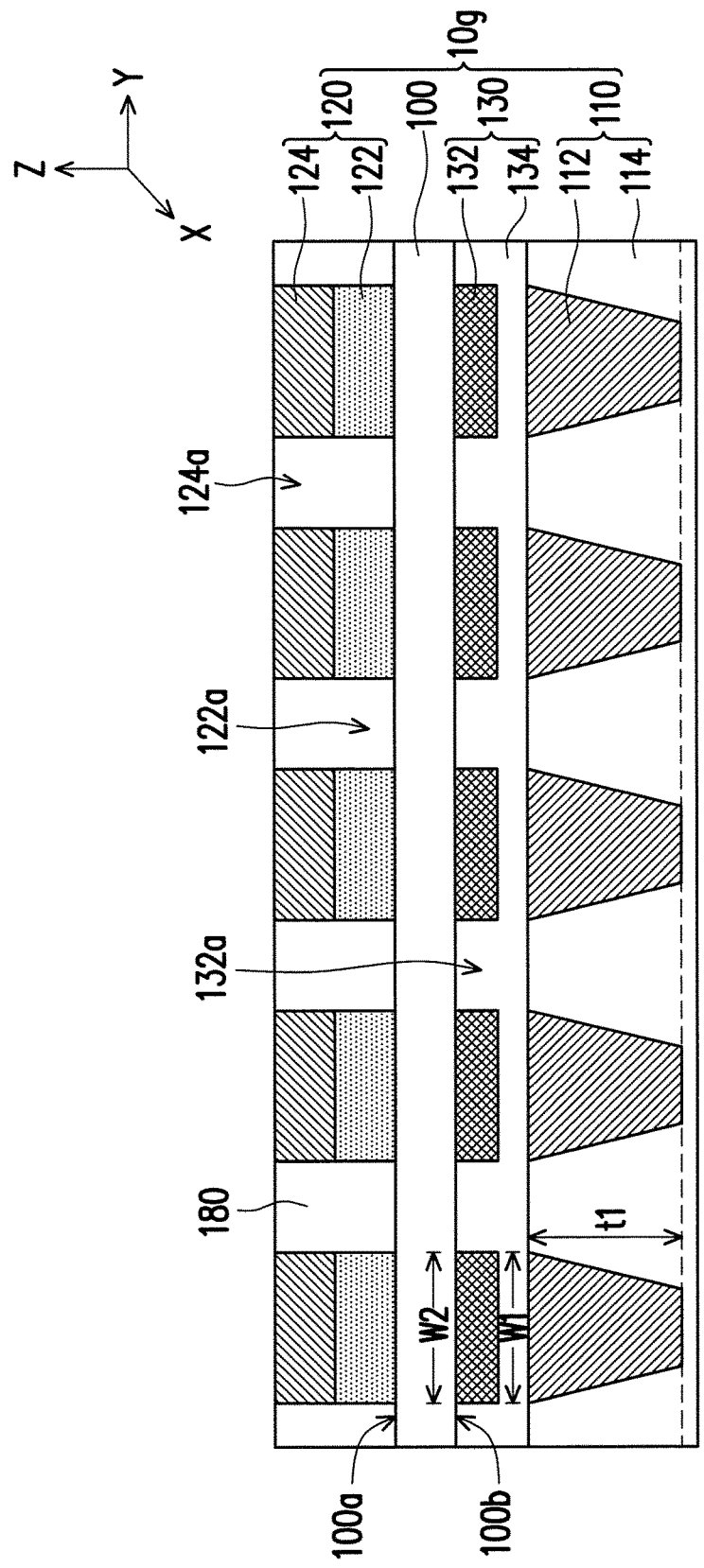

Referring to FIG. 7D, a protective structure 10g is similar to the embodiment of FIG. 7C, but in this embodiment, the second opening regions 122a and the third opening regions 124a overlap each other, and a dielectric layer 180 is filled into the second opening regions 122a and the third opening regions 124a. The dielectric layer 180 does not cover the surface anti-scratch layer 124, so that a surface of the surface anti-scratch layer 124 is exposed. A material of the dielectric layer 180 is silicon oxide or spin-on glass (SOG), for example.

Figure 7E:
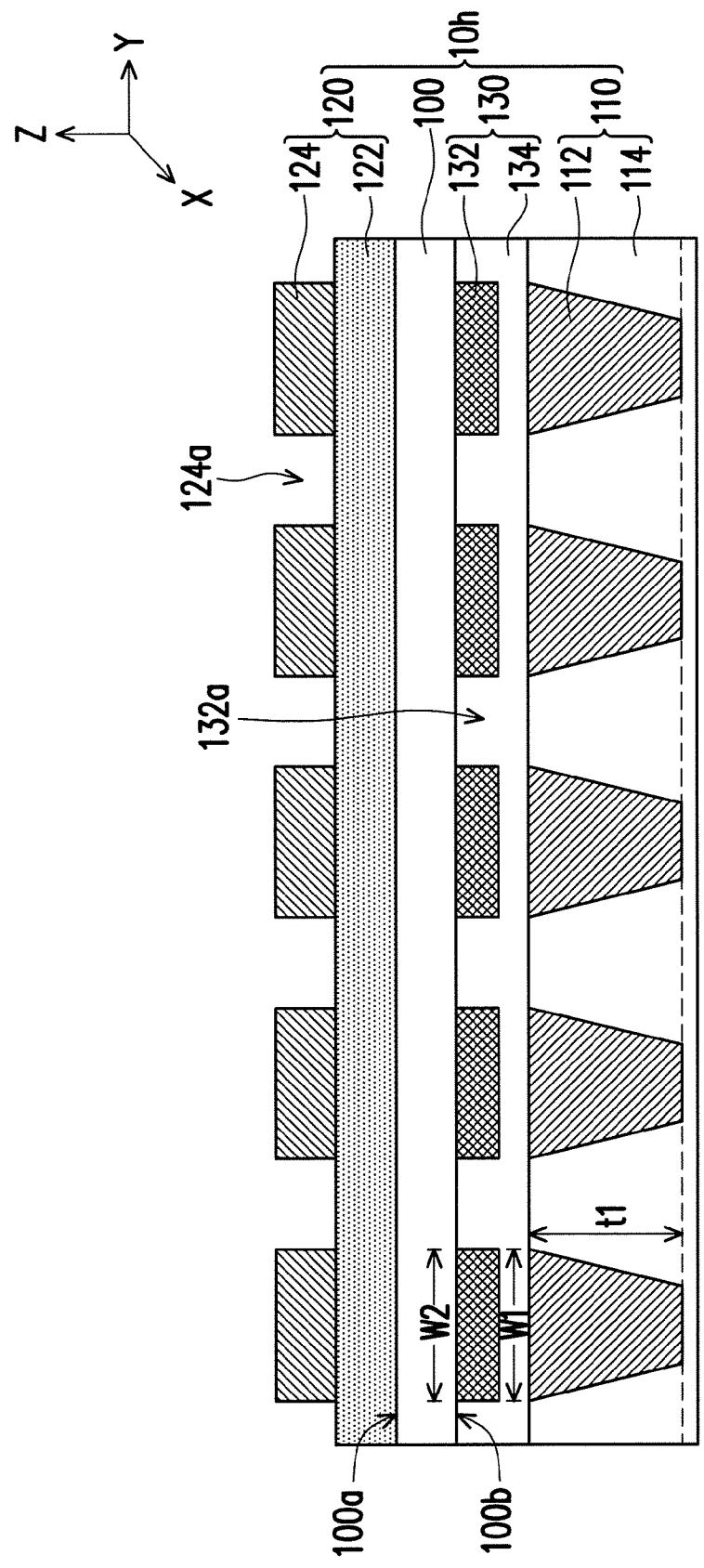

Referring to FIG. 7E, in a protective structure 10h, the hard coat layer 122 is an unpatterned layer. The surface anti-scratch layer 124 is a patterned layer. The surface anti-scratch layer 124 is a patterned layer that has the third opening regions 124a. The light filter structure 130 is selectively disposed. In an embodiment where the light filter structure 130 is disposed, the surface anti-scratch layer 124 and the light filter layers 132 are arranged corresponding to each other or not corresponding to each other. The surface anti-scratch layer 124 and the light filter layers 132 may have the same, similar, or different patterns. In other words, the third opening regions 124a of the surface anti-scratch layer 124 and the first opening regions 132a of the light filter layers 132 may overlap completely or partially. The third opening regions 124a and the first opening regions 132a may have the same or different sizes.

Figure 7F:
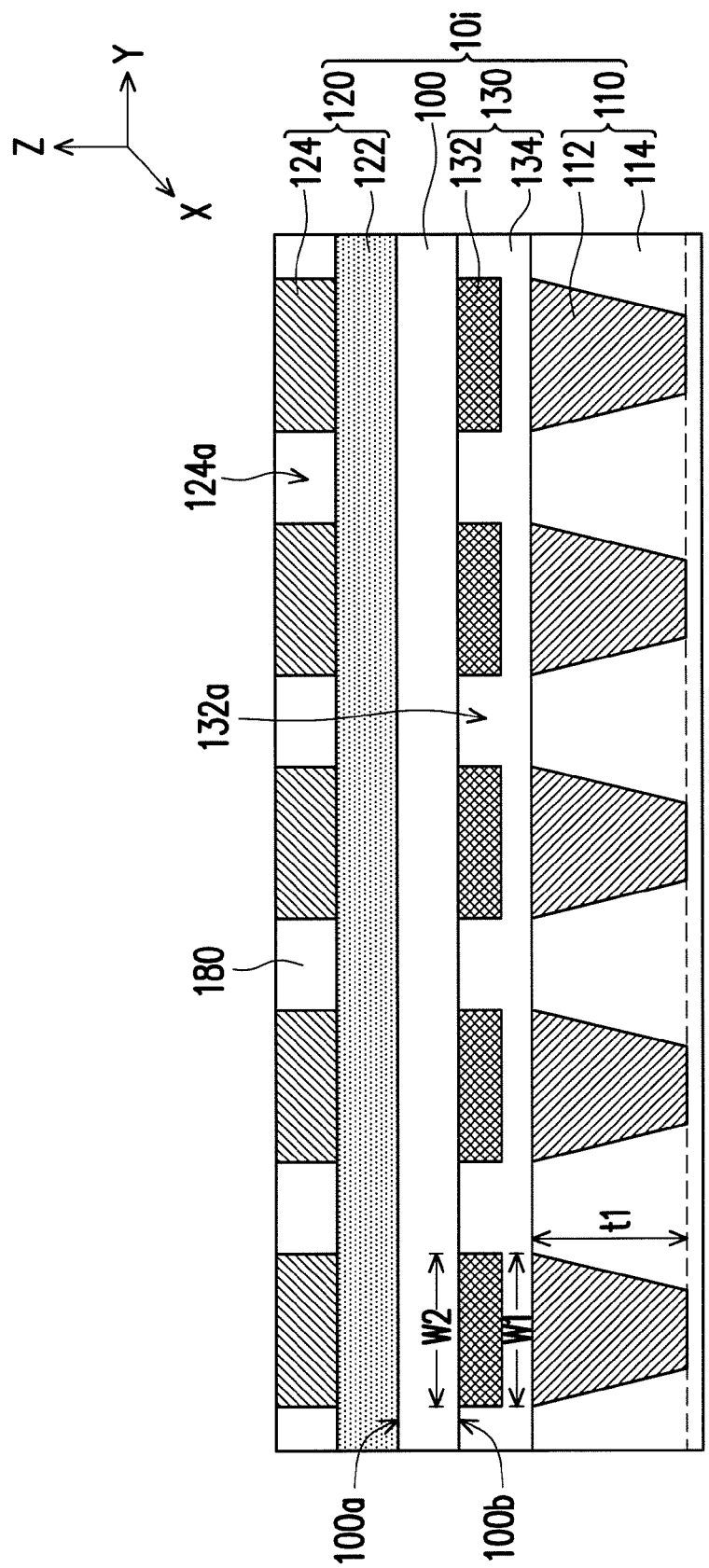

Referring to FIG. 7F, a protective structure 10i is similar to the embodiment of FIG. 7E, but in this embodiment, the dielectric layer 180 is filled into the third opening regions 124a.

The protective structures 10d to 10i shown in FIG. 7A to FIG. 7F may be formed in a manner similar to the embodiments of FIG. 5B to FIG. 5D, which are directly attached to the electronic device 160 through the adhesive layer 150, or attached to the electronic device 160 on the second substrate 170, or attached to the second substrate 170 including the electronic device 160 through the adhesive layer 150. The electronic device 160 may be as described above. In the following embodiments, the electronic device 160 is a display device and the protective structure is the protective structure 10h.

Figure 7G:
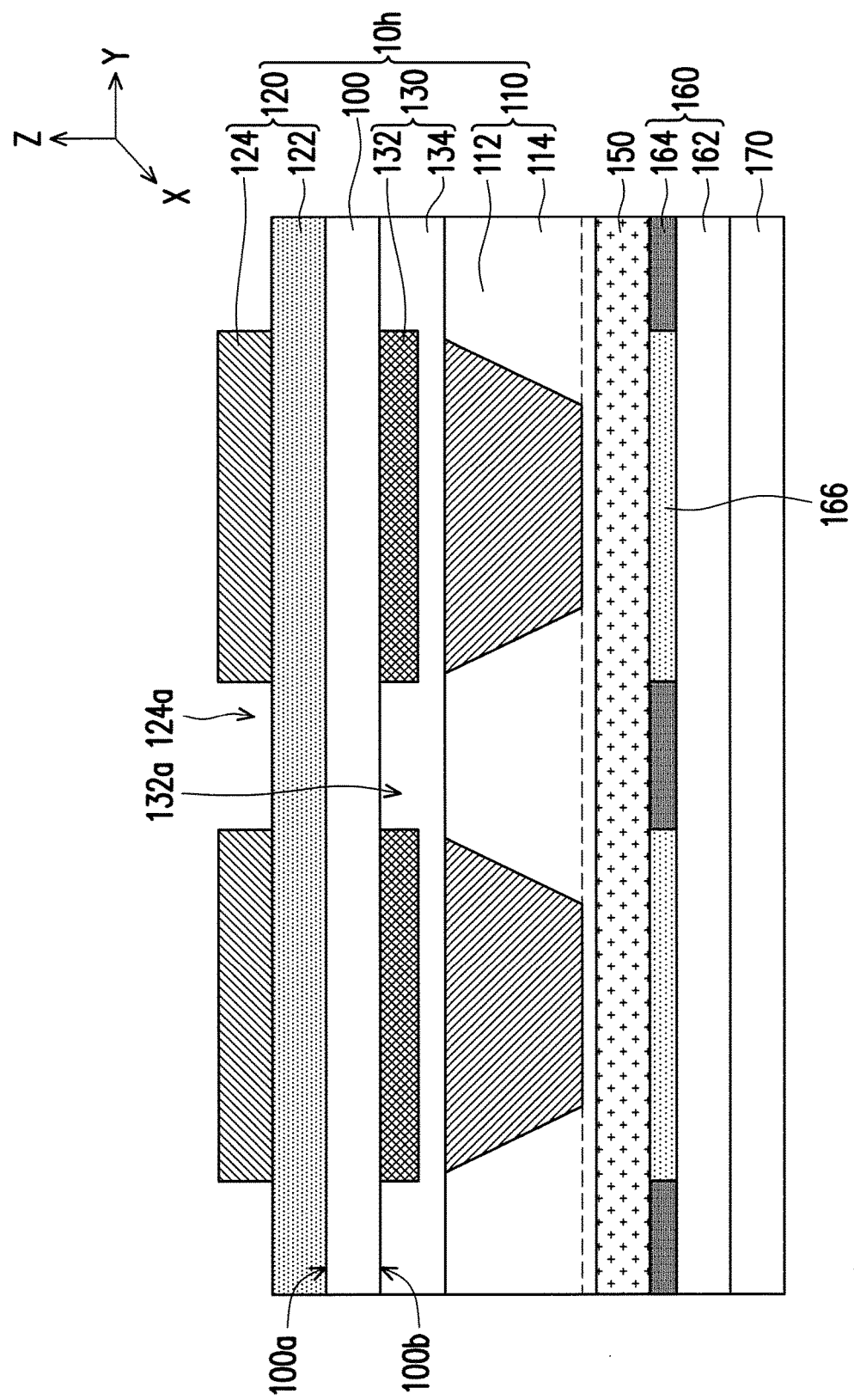
Figure 7H:
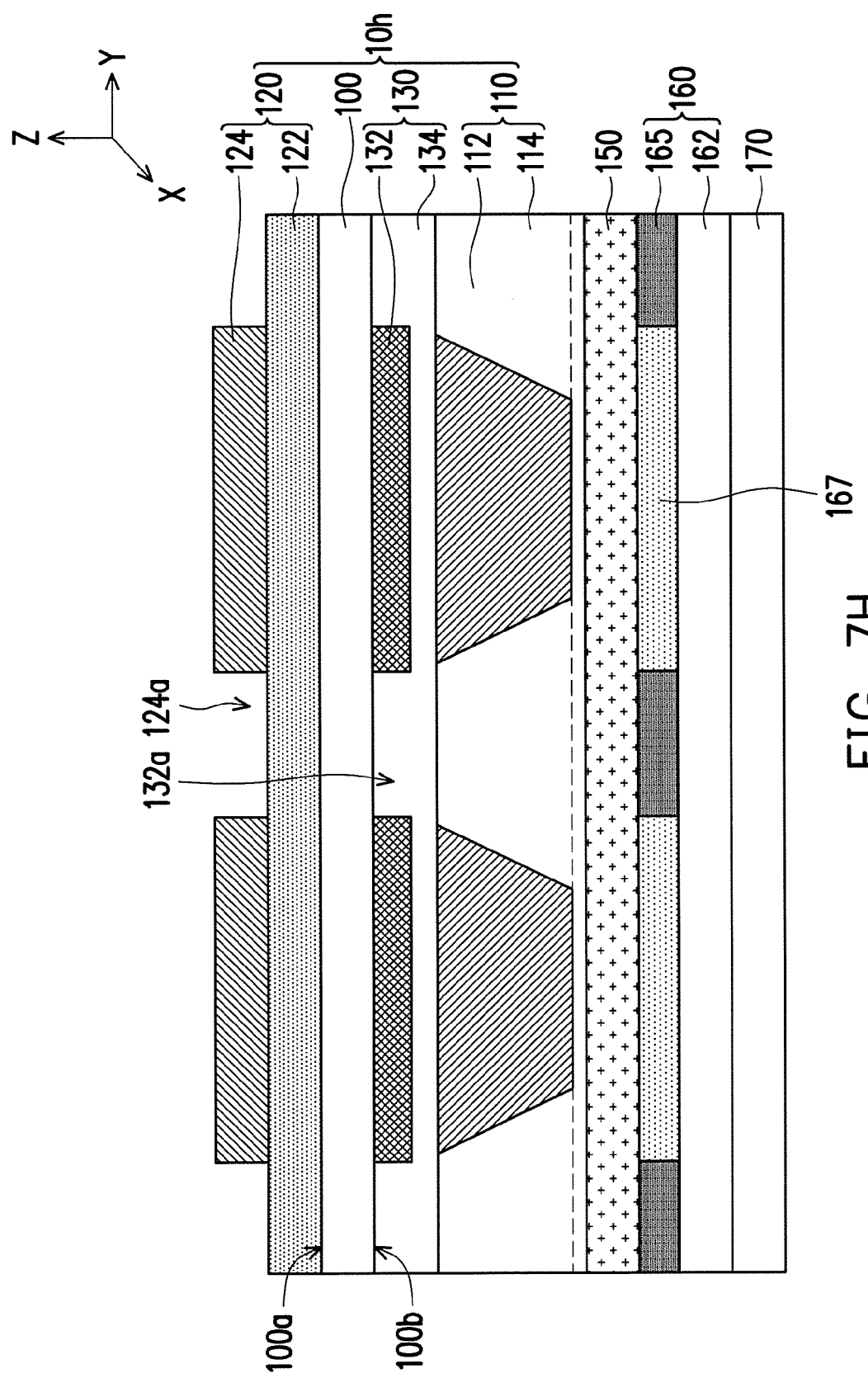

FIG. 7G to FIG. 7H are schematic cross-sectional views of several electronic apparatuses according to some embodiments of the disclosure.

Referring to FIG. 7G, in some embodiments, the protective structure 10h is attached to the electronic device 160 on the second substrate 170 through the adhesive layer 150. The electronic device 160 is a display device, which includes a display driving circuit layer 162, a plurality of color filter layers (CF) 164, and a plurality of black-material layers (BM) 166. The black-material layers 166 and the color filter layers 164 are located on the display driving circuit layer 162. The black-material layers 166 are located beside the color filter layers 164. The surface anti-scratch layer 124 is a patterned layer that has the third opening regions 124a. The buffer structures 112, the light filter layers 132, and the surface anti-scratch layer 124 are located over the black-material layers 166. Projections of the color filter layers 164, projections of the first opening regions 132a of the light filter layers 132, and projections of the third opening regions 124a of the surface anti-scratch layer 124 on an X-Y plane overlap completely or partially. In some embodiments, an overlapping area of the projections of the third opening regions 124a of the surface anti-scratch layer 124 and the color filter layers 164 on the X-Y plane is at least equal to or greater than 70%.

Referring to FIG. 7H, in some embodiments, the protective structure 10h is attached to the electronic device 160 on the second substrate 170 through the adhesive layer 150. The electronic device 160 may be a flexible electronic device. The electronic device 160 is a display device, which includes the display driving circuit layer 162, a plurality of display regions 165, and a plurality of non-display regions 167, for example. The display regions 165 and the non-display regions 167 are located on the display driving circuit layer 162. The non-display regions 167 are located beside the display regions 165. The surface anti-scratch layer 124 is a patterned layer that has the third opening regions 124a. The buffer structures 112, the light filter layers 132, and the surface anti-scratch layer 124 are located over the non-display regions 167. Projections of the display regions 165, the projections of the first opening regions 132a of the light filter layers 132, and the projections of the third opening regions 124a of the surface anti-scratch layer 124 on the X-Y plane overlap completely or partially. In some embodiments, an overlapping area of the projections of the third opening regions 124a of the surface anti-scratch layer 124 and the display regions 165 on the X-Y plane is at least equal to or greater than 70%.

In the embodiments of FIG. 7G and FIG. 7H, the light filter layers 132 and the planar layer 134 may be selectively manufactured respectively. That is, in some embodiments, the light filter layers 132 and the planar layer 134 are retained in the protective structure 10h to serve as a portion of the buffer structures and a portion of the filling structures. In other embodiments, the protective structure 10h does not include the light filter layers 132 or the planar layer 134, or includes neither. Moreover, the hard coat layer 122 may also be a patterned layer. That is, the protective structure 10h is replaced by the protective structure 10f of FIG. 7C. In other embodiments, any of the protective structures 10d to 10g as shown in FIG. 7A to FIG. 7D or the protective structure 10i of FIG. 7F may be attached to the electronic device 160 on the second substrate 170 through the adhesive layer 150.

Figure 8A:
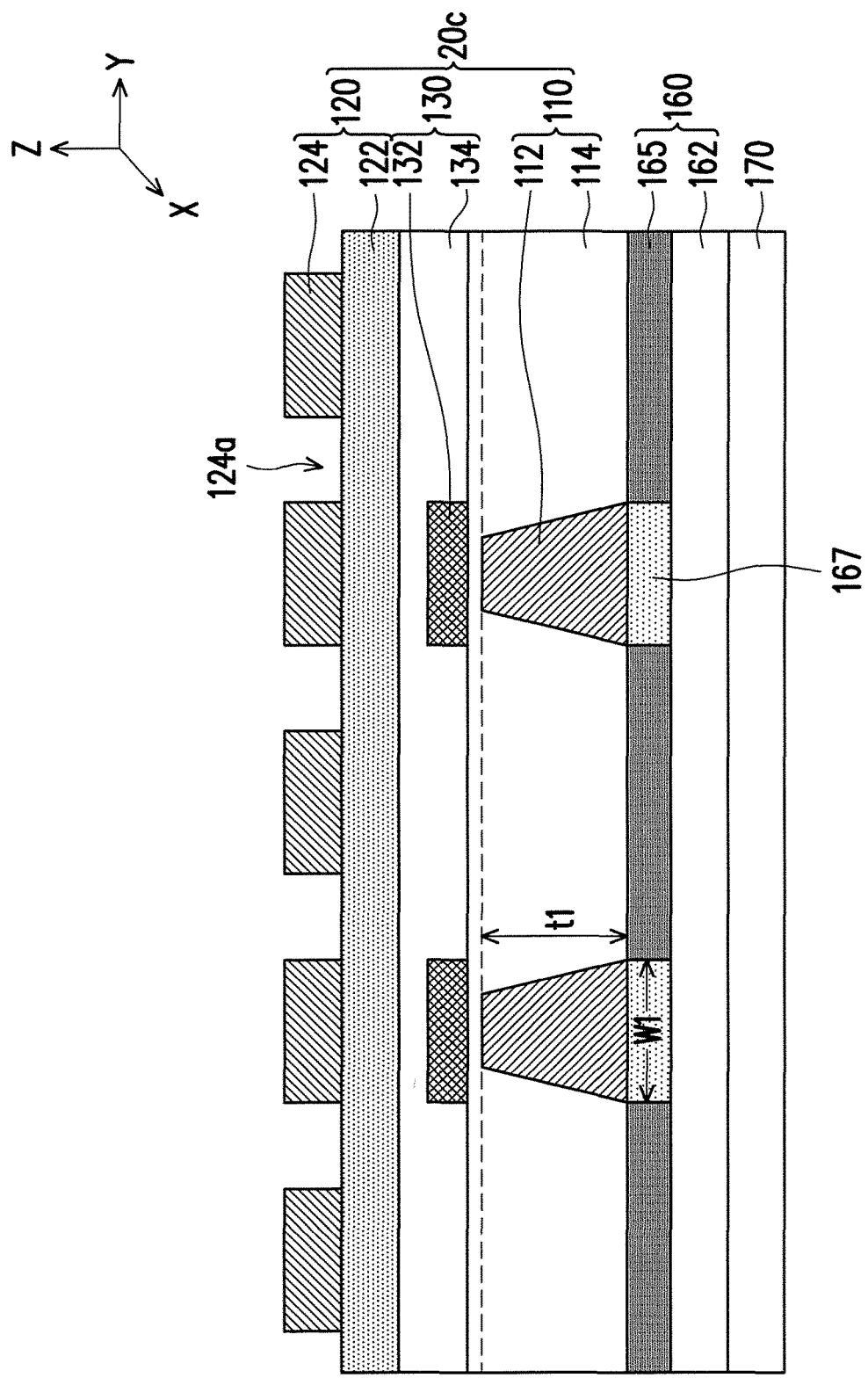
Figure 8B:
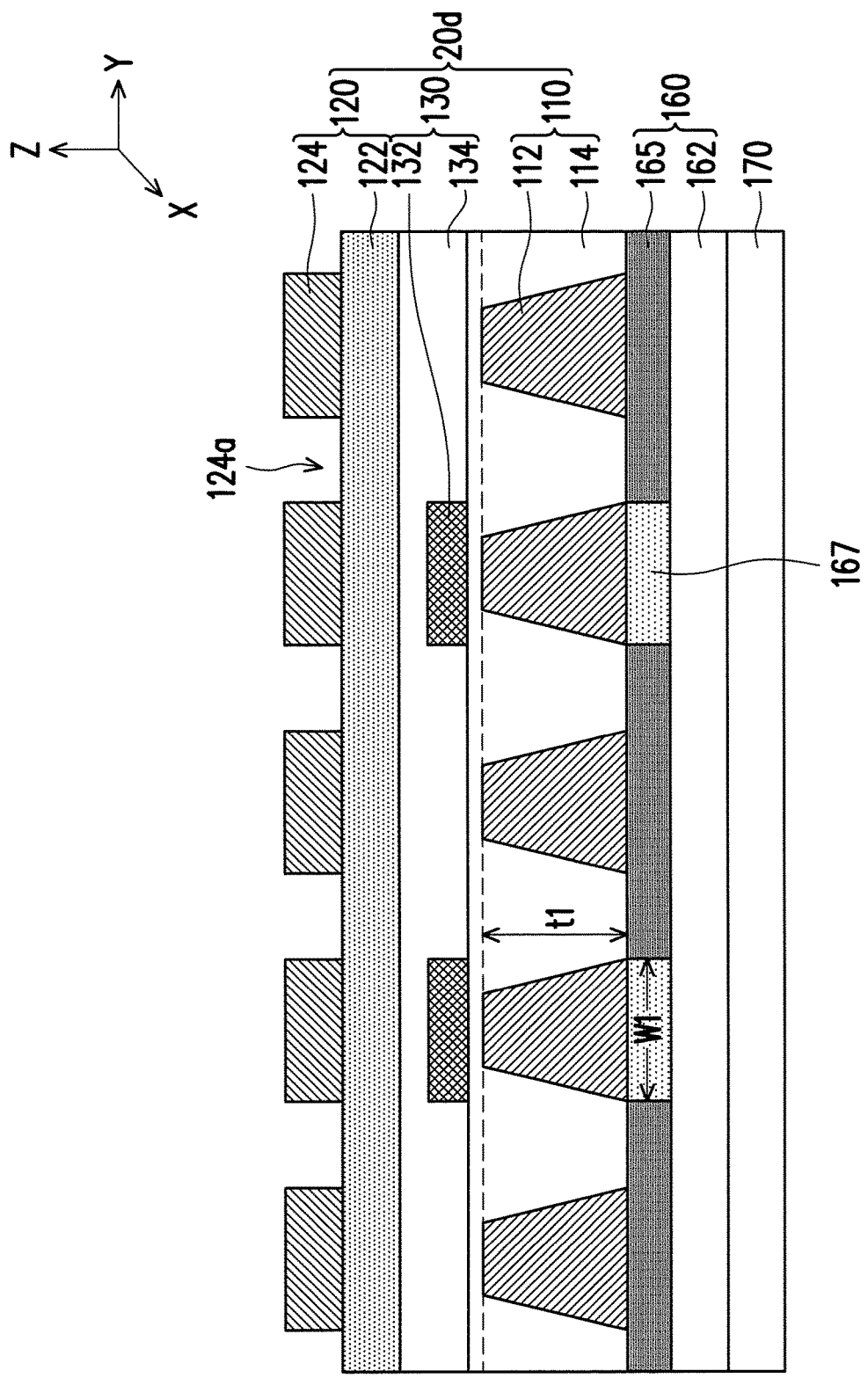

FIG. 8A to FIG. 8B are schematic cross-sectional views of several electronic apparatuses according to some embodiments of the disclosure, in which the protective structure does not include the first substrate 100.

Referring to FIG. 8A and FIG. 8B, the electronic apparatus according to some other embodiments of the disclosure includes a protective structure 20c/20d, the second substrate 170, and the electronic device 160. The protective structures 20c and 20d respectively include the anti-scratch structure 120, the light filter structure 130, and the impact resistant structure 110, but do not include the first substrate 100. The protective structures 20c and 20d are located over the electronic device 160 on the second substrate 170. The electronic device 160 may be a flexible electronic device. The electronic device 160 is a display device, which includes the display driving circuit layer 162, a plurality of display regions 165, and a plurality of non-display regions 167, for example. The display regions 165 and the non-display regions 167 are located on the display driving circuit layer 162. The non-display regions 167 are located beside the display regions 165.

In the embodiments of FIG. 8A and FIG. 8B, the surface anti-scratch layer 124 of the anti-scratch structure 120 is an unpatterned layer or a patterned layer that has the third opening regions 124a. Likewise, the hard coat layer 122 may be an unpatterned layer or a patterned layer. In FIG. 8A and FIG. 8B, the surface anti-scratch layer 124 is a patterned layer that has the third opening regions 124a; and the hard coat layer 122 is an unpatterned layer.

Referring to FIG. 8A, the light filter structure 130 is selectively disposed. In an embodiment where the light filter structure 130 is disposed, the light filter structure 130 is located between the anti-scratch structure 120 and the impact resistant structure 110. In an embodiment, the light filter structure 130 is in direct contact with the anti-scratch structure 120, and is in direct contact with the impact resistant structure 110. In an embodiment, the light filter layers 132, the buffer structures 112, and the non-display regions 167 are disposed corresponding to one another. The light filter layers 132 are located over the buffer structures 112, and the buffer structures 112 are located on the non-display regions 167 and are in contact with the non-display regions 167. The buffer structures 112 and the light filter layers 132 are not disposed over the display regions 165.

Referring to FIG. 8B, the protective structure 20d is similar to the protective structure 20c. Nevertheless, the buffer structures 112 are disposed over both the display regions 165 and the non-display regions 167 to be in contact with the display regions 165 and the non-display regions 167. The light filter layers 132 are located over the buffer structures 112 above the non-display regions 167, but are not disposed over the buffer structures 112 above the display regions 165.

Referring to FIG. 8A and FIG. 8B, the protective structure 20c or 20d may be formed directly over the electronic device 160 on the second substrate 170 without being attached through the adhesive layer. In some embodiments, the impact resistant structure 110 is formed on the electronic device 160 of the second substrate 170 first. In some embodiments, a method of forming the impact resistant structure 110 includes forming the buffer structures 112 on the electronic device 160 first, and then filling the filling structures 114 into the gaps between the buffer structures 112. The filling structures 114 may cover the upper surfaces of the buffer structures 112 or not. Thereafter, the light filter structure 130 is formed on the impact resistant structure 110. In some embodiments, a method of forming the light filter structure 130 includes forming the light filter layers 132 on the impact resistant structure 110 first, and then forming the planar layer 134. The planar layer 134 may cover the upper surfaces of the light filter layers 132 or not. Thereafter, the anti-scratch structure 120 is formed on the light filter structure 130. The anti-scratch structure 120 may be formed by forming the hard coat layer 122 on the light filter structure 130 first, and then forming the surface anti-scratch layer 124 thereon.

Furthermore, the protective structure includes the impact resistant structure 110 in the above embodiments of FIG. 5A to FIG. 8B, but may not include the impact resistant structure 110 in other embodiments. Several embodiments are provided below for illustration. The hard coat layer 122 and the surface anti-scratch layer 124 in the following embodiments are unpatterned layers. In other embodiments, however, one of the hard coat layer 122 and the surface anti-scratch layer 124 may be an unpatterned layer while the other is a patterned layer, or both may be patterned layers, as shown in FIG. 7A to FIG. 7F.

FIG. 9A to FIG. 9G are schematic cross-sectional views of several protective structures that respectively include the first substrate 100 according to some embodiments of the disclosure.

Figure 9A:
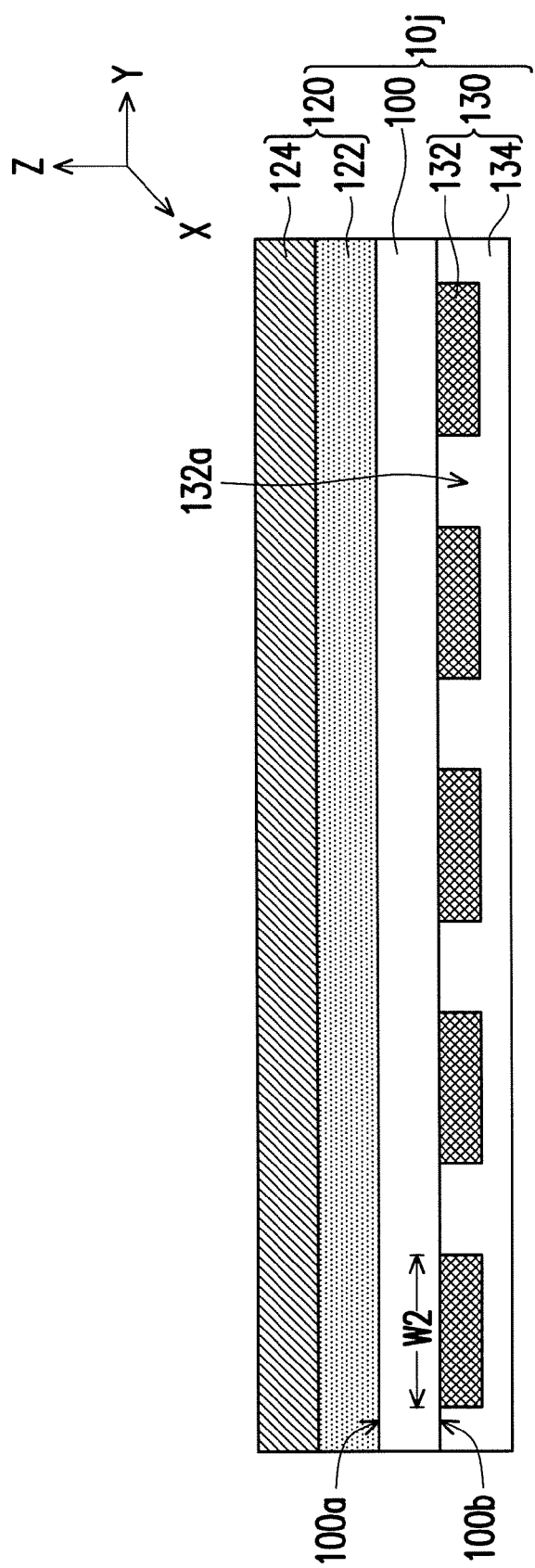

Referring to FIG. 9A, in an embodiment of the disclosure, a protective structure 10j includes the anti-scratch structure 120, the first substrate 100, and the light filter structure 130. Details of the first substrate 100, the anti-scratch structure 120, and the light filter structure 130 are specified in the above embodiments. The protective structure 10j may be formed by the method specified in the embodiment of FIG. 5A but without formation of the impact resistant structure 110. Thus, details thereof are not repeated hereinafter.

Figure 9B:
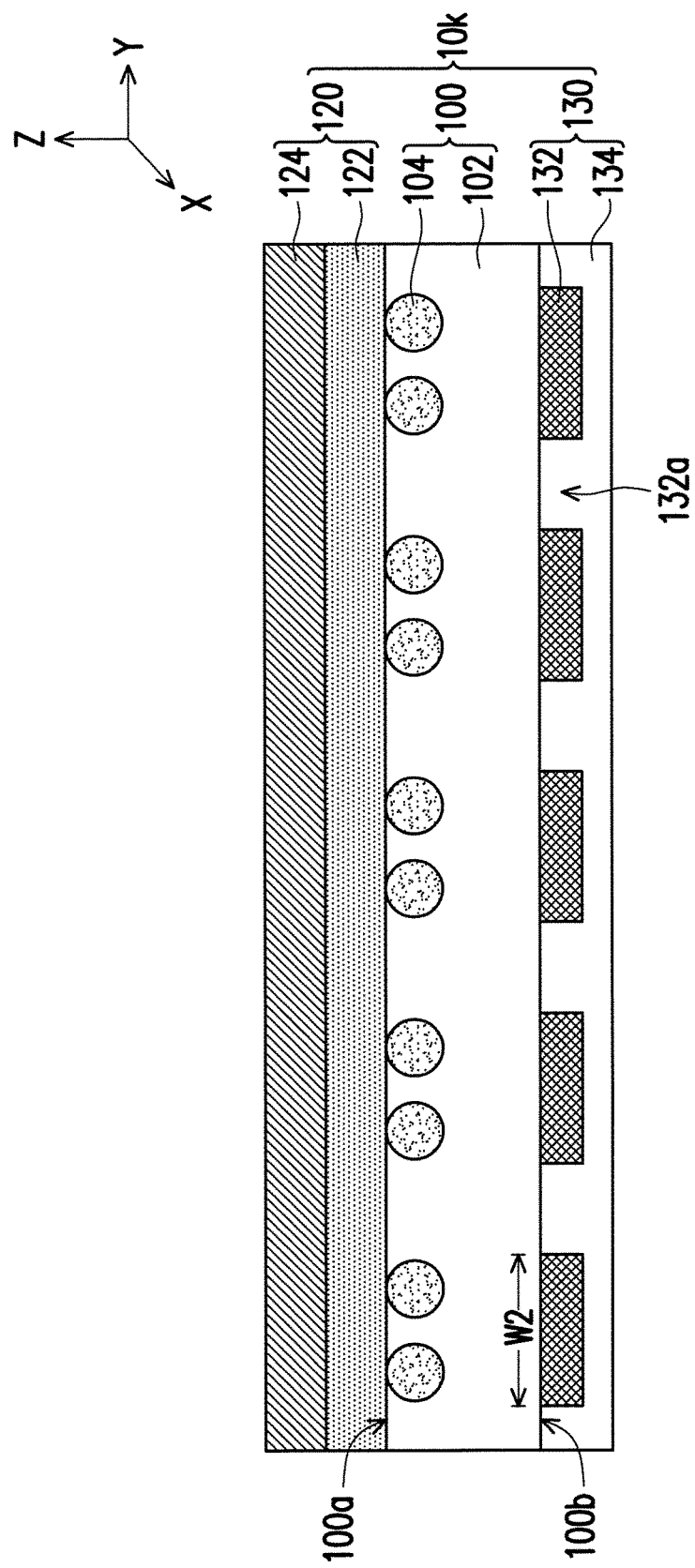

Referring to FIG. 9B, in an embodiment of the disclosure, a protective structure 10k includes the anti-scratch structure 120, the first substrate 100, and the light filter structure 130. Details of the anti-scratch structure 120 and the light filter structure 130 have been specified above and thus are not repeated hereinafter. The first substrate 100 is a hybrid substrate including the organic material 102 and the inorganic material 104. The light filter structure 130 is located on the second surface 100b of the first substrate 100. The light filter structure 130 includes a plurality of light filter layers 132 and the planar layer 134. The inorganic material 104 and the light filter layers 132 are disposed completely or partially corresponding to each other. Projections of the inorganic material 104 and the light filter layers 132 on the X-Y plane may overlap partially. In some embodiments, an overlapping area of the projections of the inorganic material 104 and the light filter layers 132 on the X-Y plane is 70% or more.

Figure 9C:
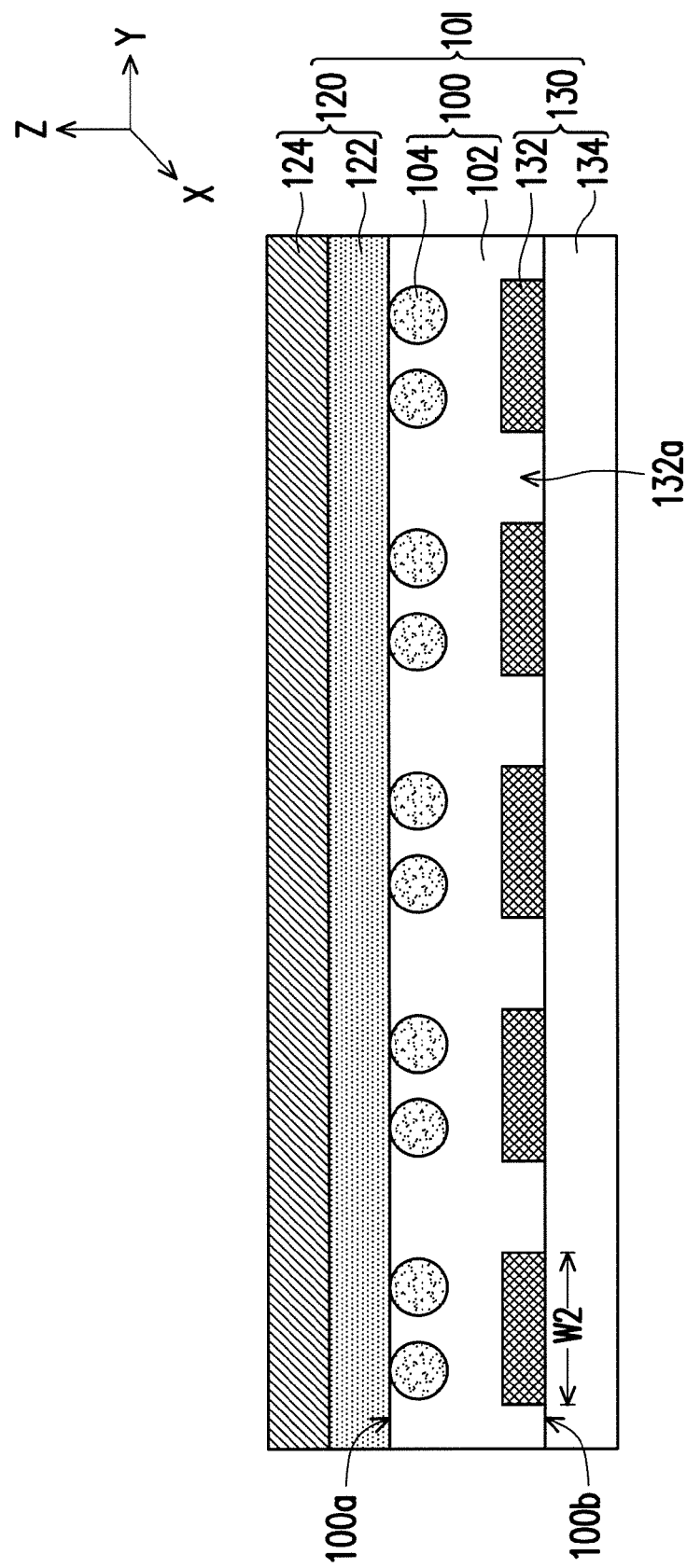

Referring to FIG. 9C, in an embodiment of the disclosure, a protective structure 10l includes the anti-scratch structure 120, the first substrate 100, and the light filter structure 130. Details of the anti-scratch structure 120 and the light filter structure 130 have been specified above and thus are not repeated hereinafter. The first substrate 100 is a hybrid substrate including the organic material 102 and the inorganic material 104. The inorganic material 104 and the light filter layers 132 are respectively embedded in the first surface 100a and the second surface 100b of the first substrate 100. The inorganic material 104 and the light filter layers 132 are disposed completely or partially corresponding to each other. The projections of the inorganic material 104 and the light filter layers 132 on the X-Y plane may overlap partially. In some embodiments, an overlapping area of the projections of the inorganic material 104 and the light filter layers 132 on the X-Y plane is 70% or more.

Figure 9D:
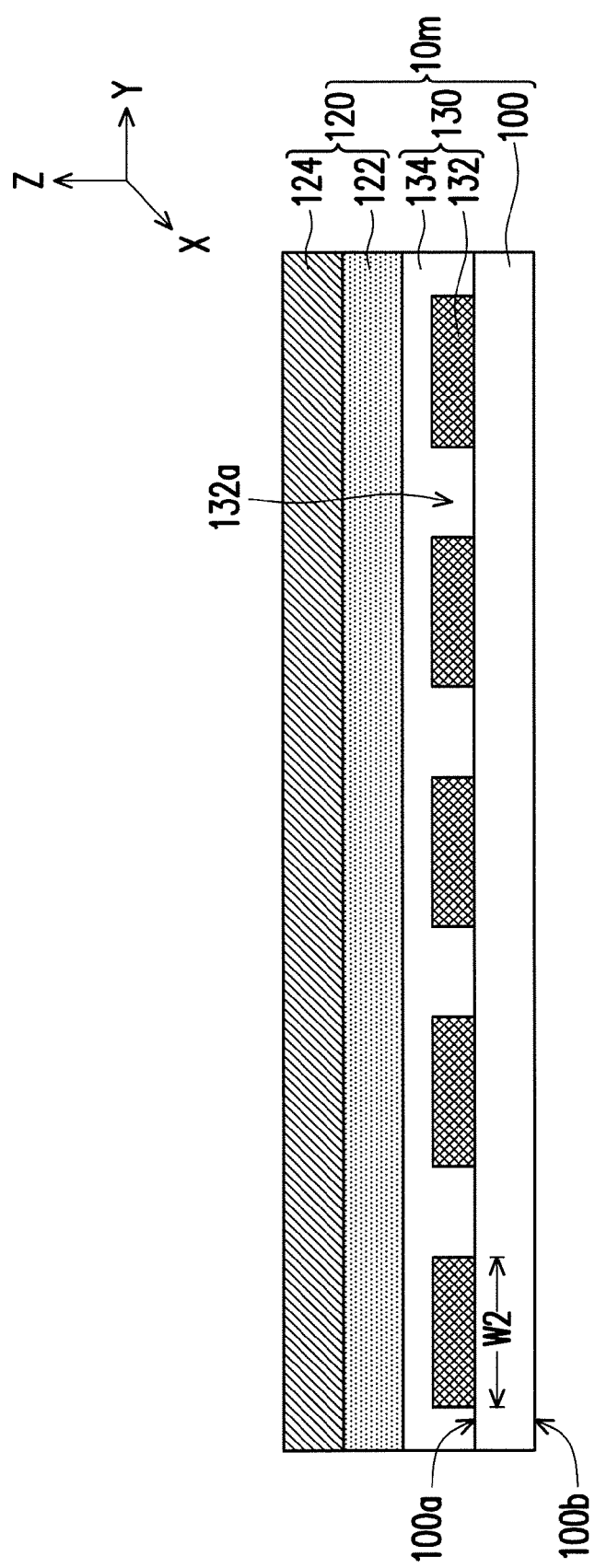

Referring to FIG. 9D, in an embodiment of the disclosure, a protective structure 10m includes the anti-scratch structure 120, the first substrate 100, and the light filter structure 130. Details of the first substrate 100 and the anti-scratch structure 120 have been specified above and thus are not repeated hereinafter. The light filter layers 132 are located on the first surface 100a of the first substrate 100, that is, located between the first substrate 100 and the anti-scratch structure 120. The planar layer 134 is located on the first surface 100a of the first substrate 100 and filled into the first opening regions 132a of the light filter layers 132. The second surface 100b of the first substrate 100 is exposed.

Figure 9E:
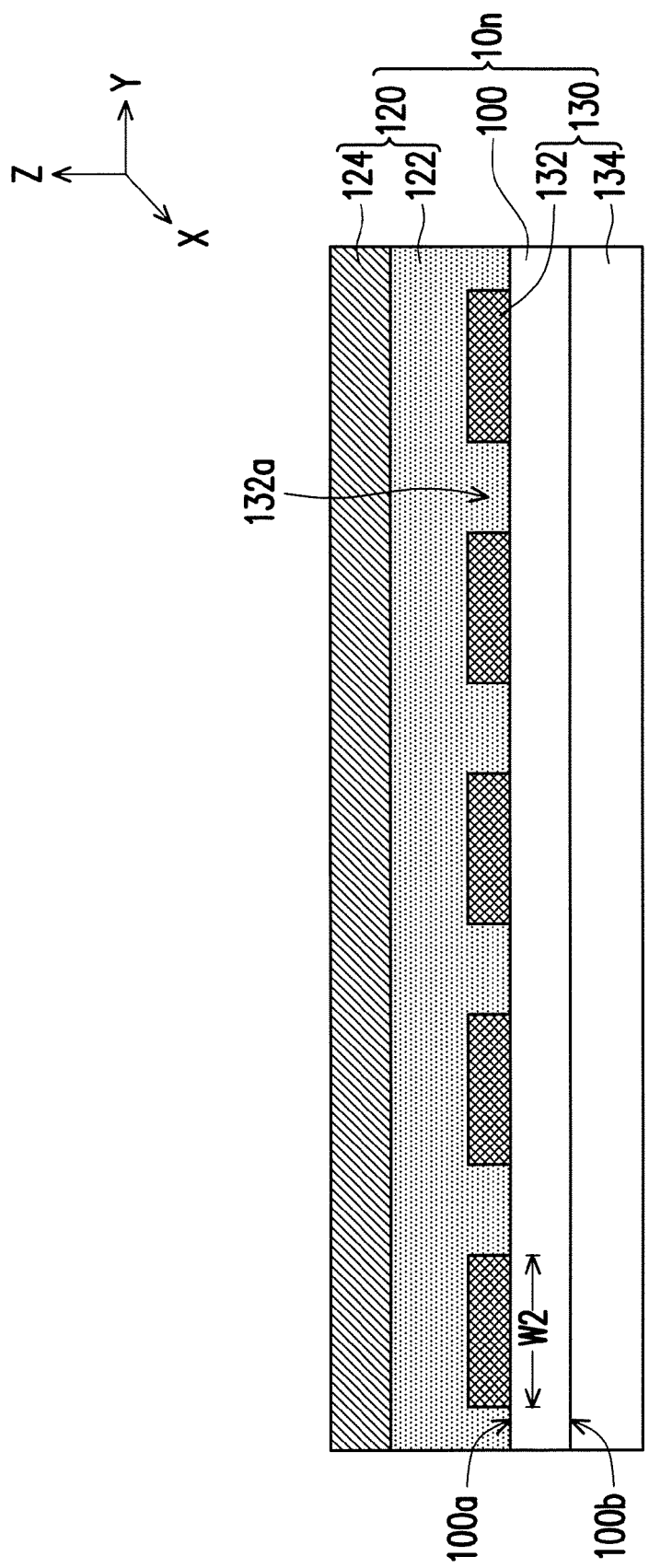

Referring to FIG. 9E, in an embodiment of the disclosure, a protective structure 10n includes the anti-scratch structure 120, the first substrate 100, and the light filter structure 130. Details of the first substrate 100 have been specified above and thus are not repeated hereinafter. The light filter layers 132 of the light filter structure 130 are located on the first surface 100a of the first substrate 100, and the hard coat layer 122 covers the light filter layers 132 and is filled into the first opening regions 132a of the light filter layers 132. The surface anti-scratch layer 124 is located on the hard coat layer 122. The planar layer 134 of the light filter structure 130 is located on the second surface 100b of the first substrate 100.

Figure 9F:
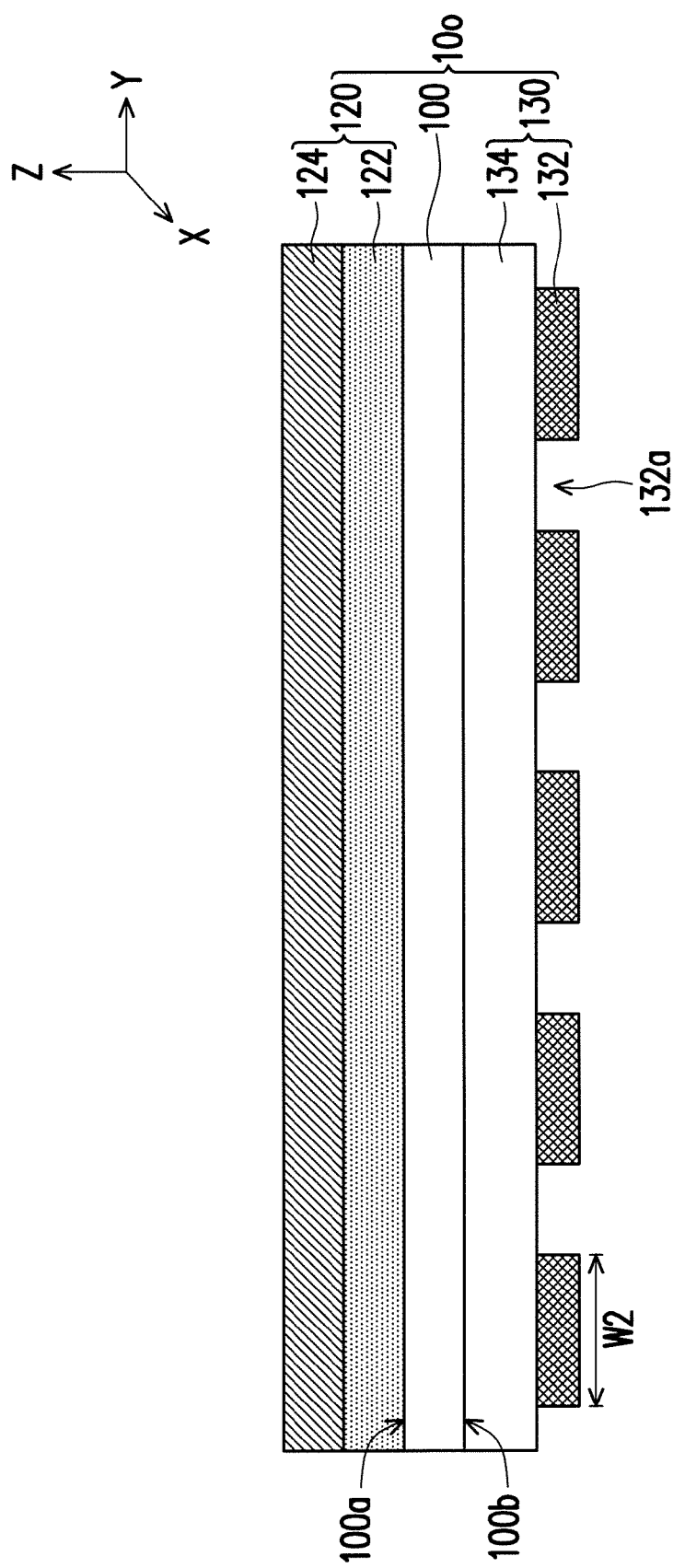

Referring to FIG. 9F, in an embodiment of the disclosure, a protective structure 10o includes the anti-scratch structure 120, the first substrate 100, and the light filter structure 130. Details of the first substrate 100 and the anti-scratch structure 120 have been specified above and thus are not repeated hereinafter. The light filter structure 130 is located on the second surface 100b of the first substrate 100, and the planar layer 134 is located between the second surface 100b of the first substrate 100 and the light filter layers 132.

Figure 9G:
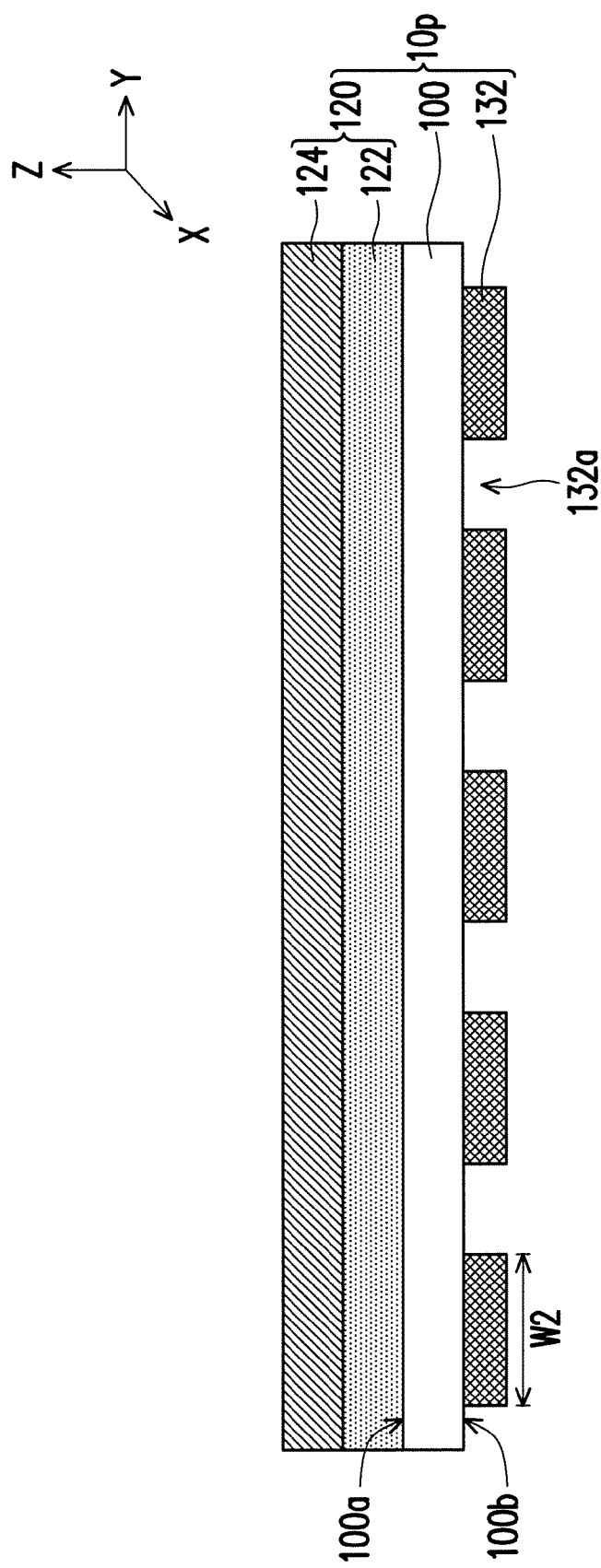

Referring to FIG. 9G, in an embodiment of the disclosure, a protective structure 10p is similar to the protective structure 10o of FIG. 8F, but does not include the planar layer 134.

The protective structures 10j to 10p shown in FIG. 9A to FIG. 9G may be formed in a manner similar to the embodiments of FIG. 5B to FIG. 5D, which are directly attached to the electronic device 160 through the adhesive layer 150 or attached to the electronic device 160 on the second substrate 170, or attached to the second substrate 170 including the electronic device 160 through the adhesive layer 150.

Figure 9H:
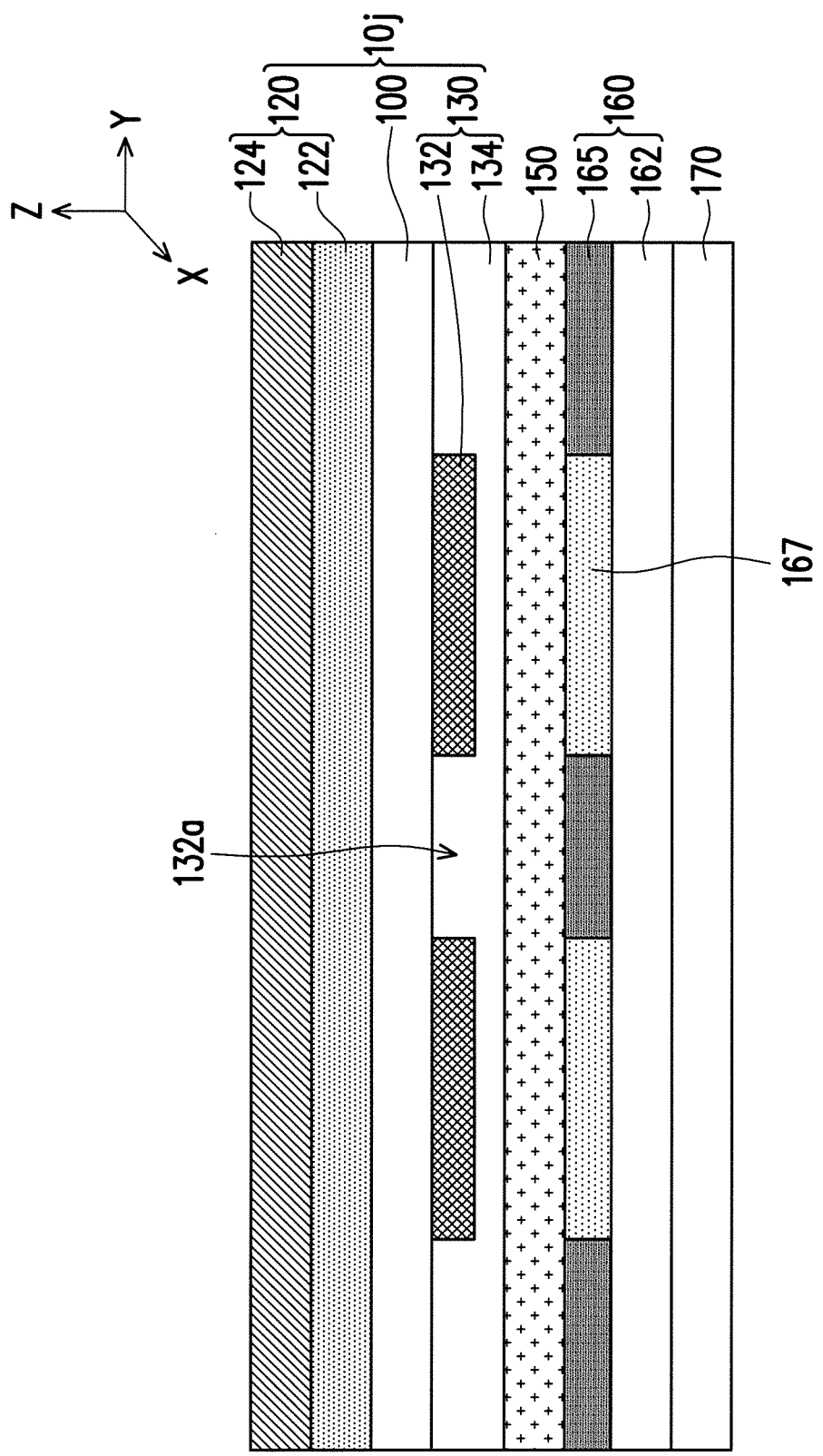

For example, referring to FIG. 9H, an electronic apparatus according to an embodiment of the disclosure includes the protective structure 10j, the electronic device 160, and the second substrate 170. Moreover, the protective structure 10j is directly attached to the electronic device 160 on the second substrate 170 through the adhesive layer 150. The electronic device 160 may be a flexible electronic device. The electronic device 160 is a display device, which includes the display driving circuit layer 162, a plurality of display regions 165, and a plurality of non-display regions 167, for example. The display regions 165 and the non-display regions 167 are located on the display driving circuit layer 162. The non-display regions 167 are located beside the display regions 165. The light filter layers 132 are disposed over the non-display regions 167. The first opening regions 132a of the light filter layers 132 and the display regions 165 overlap completely or partially. In some embodiments, an overlapping area of the projections of the first opening regions 132a and the display regions 165 on the X-Y plane is 70% or more.

Figure 10A:
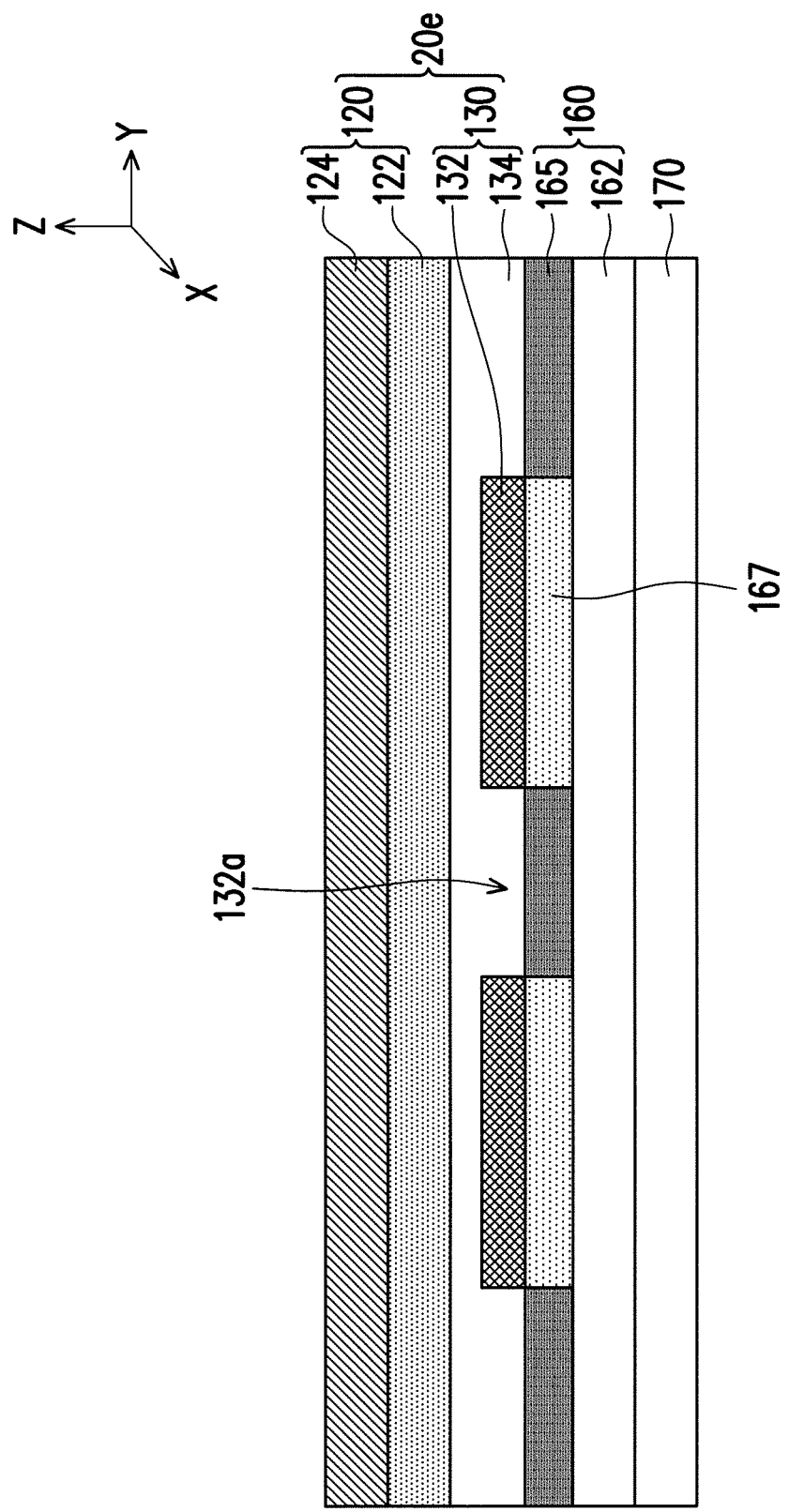
Figure 10B:
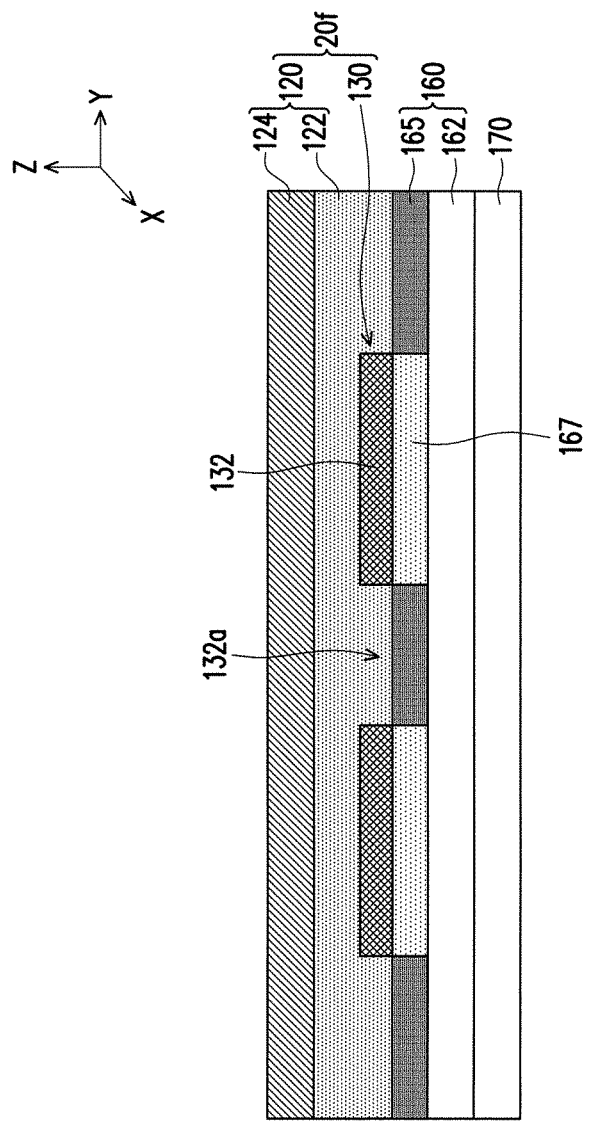

FIG. 10A to FIG. 10C are schematic cross-sectional views of several electronic apparatuses according to some embodiments of the disclosure, in which the protective structure does not include the first substrate 100.

Referring to FIG. 10A, the electronic apparatus according to an embodiment of the disclosure includes a protective structure 20e, the electronic device 160, and the second substrate 170. The protective structure 20e includes the anti-scratch structure 120 and the light filter structure 130, but does not include the first substrate 100. The protective structure 20e is formed over the electronic device 160 on the second substrate 170. The electronic device 160 may be a flexible electronic device. The electronic device 160 is a display device, which includes the display driving circuit layer 162, a plurality of display regions 165, and a plurality of non-display regions 167, for example. The display regions 165 and the non-display regions 167 are located on the display driving circuit layer 162. The non-display regions 167 are located beside the display regions 165.

The light filter structure 130 is located between the anti-scratch structure 120 and the electronic device 160. In an embodiment, the light filter structure 130 is in direct contact with the anti-scratch structure 120, and is in direct contact with the electronic device 160. In some embodiments, the light filter layers 132 and the non-display regions 167 are disposed corresponding to each other. In some exemplary embodiments, the light filter layers 132 are located on the non-display regions 167 and are in contact with the non-display regions 167, but are not disposed on the display regions 165. The first opening regions 132a of the light filter layers 132 and the display regions 165 overlap completely or partially. In some embodiments, an overlapping area of the projections of the first opening regions 132a and the display regions 165 on the X-Y plane is 70% or more.

The protective structure 20e may be directly formed on the electronic device 160 on the second substrate 170 without being attached through the adhesive layer. In some embodiments, the light filter structure 130 is formed on the electronic device 160 of the second substrate 170 first. In some embodiments, a method of forming the light filter structure 130 includes forming the light filter layers 132 on the non-display regions 167 first, and then forming the planar layer 134 in the first opening regions 132a of the light filter layers 132. The planar layer 134 may cover the upper surfaces of the light filter layers 132 or not. Thereafter, the anti-scratch structure 120 is formed on the light filter structure 130. The anti-scratch structure 120 may be formed by forming the hard coat layer 122 on the light filter structure 130 first, and then forming the surface anti-scratch layer 124 thereon.

Referring to FIG. 10B, an electronic apparatus according to some other embodiments of the disclosure includes a protective structure 20f, the electronic device 160, and the second substrate 170. The protective structure 20f is similar to the protective structure 20e and includes the anti-scratch structure 120 and the light filter structure 130, but the light filter structure 130 does not include the planar layer 134. In other words, the hard coat layer 122 directly covers the light filter layers 132 and is filled into the first opening regions 132a of the light filter layers 132.

Likewise, the protective structure 20f may be directly formed on the electronic device 160 on the second substrate 170 without being attached through the adhesive layer. In some embodiments, the light filter layers 132 are formed on the non-display regions 167 of the electronic device 160 first. Thereafter, the hard coat layer 122 is formed on the light filter layers 132 and in the first opening regions 132a, and then the surface anti-scratch layer 124 is formed.

Example 1

A stack structure is provided, which includes a thin film transistor, an organic light emitting diode, an adhesive layer, a gas barrier layer, and a touch panel. A bottom surface of the stack structure is covered by a PI layer, and a surface of the stack structure is covered by a transparent PI layer. Then, the protective structure 10a of FIG. 1A is formed on the transparent PI layer above the touch panel. Next, an impact test is carried out. The impact test is to use a steel ball to hit the protective structure 10a for measuring the displacement, stress, and strain of the transparent PI layer after the stack structure receives the impact. The result is shown in Table 1 and FIG. 11.

Comparative Examples 1 and 2

Comparative Examples 1 and 2 adopt methods similar to Example 1, but the protective structure 10a is replaced by a PET layer and a PI layer respectively.

Comparative Example 3

Comparative Example 3 adopts a method similar to Example 1, but the protective structure 10a is removed to completely expose the transparent PI layer.

TABLE 1

|  | Example | Comparative Example 1 | Comparative Example 2 | Comparative Example 3 |
|---|---|---|---|---|
| Maximum displacement (mm) | −0.1285 | −0.1639 | −0.1679 | −0.1928 |
| First principal stress (Mpa) | 2.86 | −7.12 | −7.13 | −15.6 |
| Von Mises stress (Mpa) | 2.86 | 6.88 | 6.48 | 15.6 |

Figure 11:
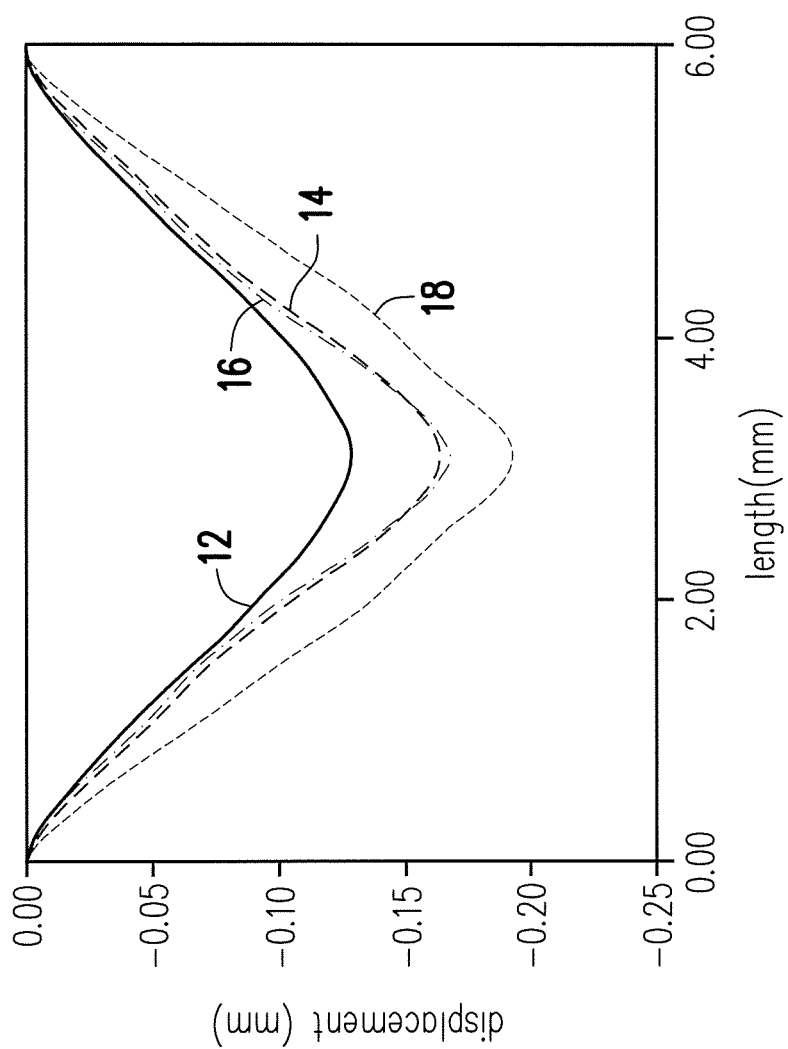
FIG. 11 is a diagram showing the relationship between the length and displacement after an impact test according to experimental examples.

Referring to FIG. 11, the curves 12, 14, 16, and 18 respectively indicate displacements of the structures of Example 1, Comparative Example 1, Comparative Example 2, and Comparative Example 3 in the length direction after the impact.

The result of Table 1 and FIG. 11 shows that the maximum displacement generated in Example 1, which uses the protective structure of the embodiments of the disclosure, is less than those of Comparative Example 1, Comparative Example 2, and Comparative Example 3. In comparison with Comparative Example 3 in which no protective structure is disposed, the maximum displacement is reduced by 33%. Moreover, the stress is reduced significantly. The result shows that the protective structure of the embodiments of the disclosure sustains the impact effectively.

The protective structures of the embodiments of the disclosure prevent the electronic device from being scratched by an external force and reduce damage to the electronic device caused by impact or pressure of the external force, and thereby improve reliability of the electronic product.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A protective structure, comprising:
    an impact resistant structure, comprising:
        a plurality of buffer structures; and a plurality of filling structures located around the buffer structures; and an anti-scratch structure located over the impact resistant structure and comprising:
 a hard coat layer covering the impact resistant structure; and
 a surface anti-scratch layer covering the hard coat layer.

2. The protective structure according to claim 1, further comprising a first substrate that has a first surface and a second surface opposite to each other, wherein:
 the hard coat layer is located on the first surface of the first substrate; and
 the impact resistant structure is located on the second surface of the first substrate.

3. The protective structure according to claim 2, wherein the first substrate comprises a single-material substrate, a composite substrate or a hybrid substrate of organic materials, a composite substrate or a hybrid substrate of inorganic materials, or a hybrid substrate or a composite substrate of an organic material and an inorganic material.

4. The protective structure according to claim 1, further comprising a light filter structure that at least comprises a plurality of light filter layers located between the hard coat layer and the impact resistant structure.

5. The protective structure according to claim 4, further comprising a first substrate, wherein the first substrate is located between the light filter structure and the impact resistant structure, and the light filter structure comprises:
 the light filter layers located on the second surface of the first substrate; and
 a planar layer located on the second surface of the first substrate and filled into a plurality of first opening regions of the light filter layers.

6. The protective structure according to claim 4, wherein at least one of the light filter layers is disposed corresponding to one of the buffer structures.

7. The protective structure according to claim 4, wherein an order of the surface anti-scratch layer, the hard coat layer, the first substrate, the buffer structures, and the filling structures is based on a descending order of Young's moduli thereof.

8. The protective structure according to claim 1, wherein the hard coat layer is an unpatterned layer, the surface anti-scratch layer is an unpatterned layer, or the hard coat layer and the surface anti-scratch layer are both unpatterned layers.

9. The protective structure according to claim 1, wherein the hard coat layer is a patterned layer, the surface anti-scratch layer is a patterned layer, or the hard coat layer and the surface anti-scratch layer are both patterned layers.

10. A protective structure, comprising:
 a light filter structure at least comprising a plurality of light filter layers; and
 an anti-scratch structure located over the light filter structure and comprising:
  a hard coat layer covering the light filter structure; and
  a surface anti-scratch layer covering the hard coat layer,
   wherein a Young's modulus of the surface anti-scratch layer is greater than a Young's modulus of the hard coat layer.

11. The protective structure according to claim 10, further comprising a first substrate that has a first surface and a second surface opposite to each other, wherein the light filter structure comprises:
 the light filter layers located on the second surface of the first substrate; and
 a planar layer covering the second surface of the first substrate and the light filter layers and filled into a plurality of first opening regions of the light filter layers,
 wherein the hard coat layer is located on the first surface of the first substrate.

12. The protective structure according to claim 10, further comprising a first substrate that has a first surface, wherein the light filter structure comprises:
 the light filter layers located on the first surface of the first substrate; and
 a planar layer covering the first surface of the first substrate and the light filter layers and filled into a plurality of first opening regions of the light filter layers,
 wherein the hard coat layer is located on the first surface of the first substrate and covers the planar layer.

13. The protective structure according to claim 10, further comprising a first substrate that has a first surface and a second surface opposite to each other, wherein the light filter structure comprises:
 the light filter layers located on the first surface of the first substrate; and
 a planar layer located on the second surface of the first substrate,
 wherein the hard coat layer covers the first surface of the first substrate and the light filter layers and is filled into a plurality of first opening regions of the light filter layers.

14. The protective structure according to claim 10, further comprising a first substrate that has a first surface and a second surface opposite to each other, wherein the light filter structure comprises:
 the light filter layers located on the second surface of the first substrate,
 wherein the hard coat layer is located on the first surface of the first substrate.

15. The protective structure according to claim 14, further comprising a planar layer located on the second surface of the first substrate and located between the light filter layers and the first substrate.

16. The protective structure according to claim 10, wherein an order of the surface anti-scratch layer, the hard coat layer, and the first substrate is based on a descending order of the Young's moduli thereof.

17. An electronic apparatus, comprising:
 an electronic device; and
 the protective structure according to claim 1, located on the electronic device.

18. The electronic apparatus according to claim 17, wherein the electronic device is in contact with the protective structure.

19. The electronic apparatus according to claim 17, further comprising an adhesive layer located between the protective structure and the electronic device.

20. The electronic apparatus according to claim 17, further comprising a second substrate, wherein the second substrate is located between the adhesive layer and the electronic device, or the electronic device is located between the second substrate and the adhesive layer.

* * * * *